United States Patent [19]

Asakura et al.

[11] Patent Number: 5,867,439
[45] Date of Patent: Feb. 2, 1999

[54] SEMICONDUCTOR MEMORY DEVICE HAVING INTERNAL ADDRESS CONVERTING FUNCTION, WHOSE TEST AND LAYOUT ARE CONDUCTED EASILY

[75] Inventors: Mikio Asakura; Hideto Hidaka; Kiyohiro Furutani; Kenichi Yasuda, all of Hyogo, Japan

[73] Assignee: Mitsubishi Denki Kabushiki Kaisha, Tokyo, Japan

[21] Appl. No.: 22,490

[22] Filed: Feb. 12, 1998

Related U.S. Application Data

[62] Division of Ser. No. 756,505, Nov. 26, 1996, Pat. No. 5,740,119.

[30] Foreign Application Priority Data

Nov. 28, 1995 [JP] Japan .................................... 7-309311

[51] Int. Cl.$^6$ .................................................. G11C 7/00
[52] U.S. Cl. .......................... 365/222; 365/200; 365/201; 365/230.03; 365/230.06
[58] Field of Search ............... 365/230.03, 200, 365/230.06, 201, 222

[56] References Cited

U.S. PATENT DOCUMENTS

| | | | |
|---|---|---|---|
| 5,315,548 | 5/1994 | Ooishi et al. ..................... | 365/189.01 |
| 5,426,613 | 6/1995 | Takahashi et al. ..................... | 365/222 |
| 5,463,582 | 10/1995 | Kobayashi et al. ................ | 365/189.05 |
| 5,586,076 | 12/1996 | Miyamoto et al. ..................... | 365/203 |
| 5,629,900 | 5/1997 | Hirose et al. ..................... | 365/230.03 |
| 5,652,725 | 7/1997 | Suma et al. ............................ | 365/200 |
| 5,668,774 | 9/1997 | Furutani ................................. | 365/233 |

FOREIGN PATENT DOCUMENTS 4-370595  12/1994  Japan .

*Primary Examiner*—David Nelms
*Assistant Examiner*—Hien Nguyen
*Attorney, Agent, or Firm*—McDermott, Will & Emery

[57] ABSTRACT

In a semiconductor memory device selectively implementing one of a 4K refresh cycle and a 8K refresh cycle, the positions of externally applied address signal bits are switched internally by address switching circuits such that memory cells at the same positions are selected regardless of whether the 4K refresh cycle or the 8K refresh cycle is specified according to a refresh cycle mode specify signal. As a result, by testing the device in one refresh cycle mode, the device can be checked in both refresh cycle operations, reducing the test time and making the test easier.

6 Claims, 25 Drawing Sheets

WITHIN ( ) : 4K REFRESH

CSL :SELECTION OF 4 BIT LINE PAIRS
CA9,CA10 :SELECTION OF 1 BIT LINE PAIR
(CA10,CA11)
WITHIN ( ) :4K REFRESH CYCLE DEVICE

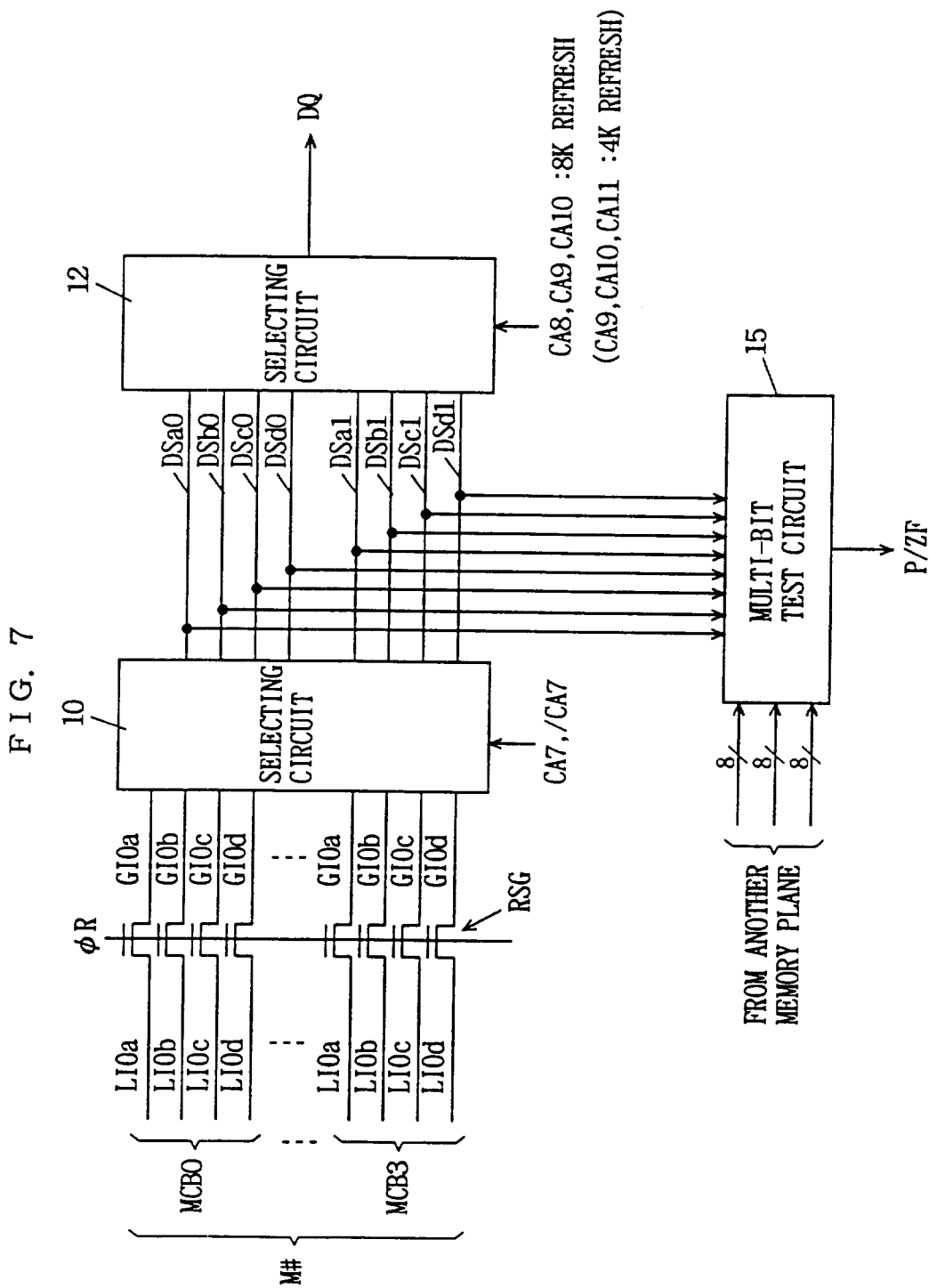

4K REFRESH ; RA12 BEING DEGENERATED (1/16 DIVISION)

8K REFRESH (1/32 DIVISION)

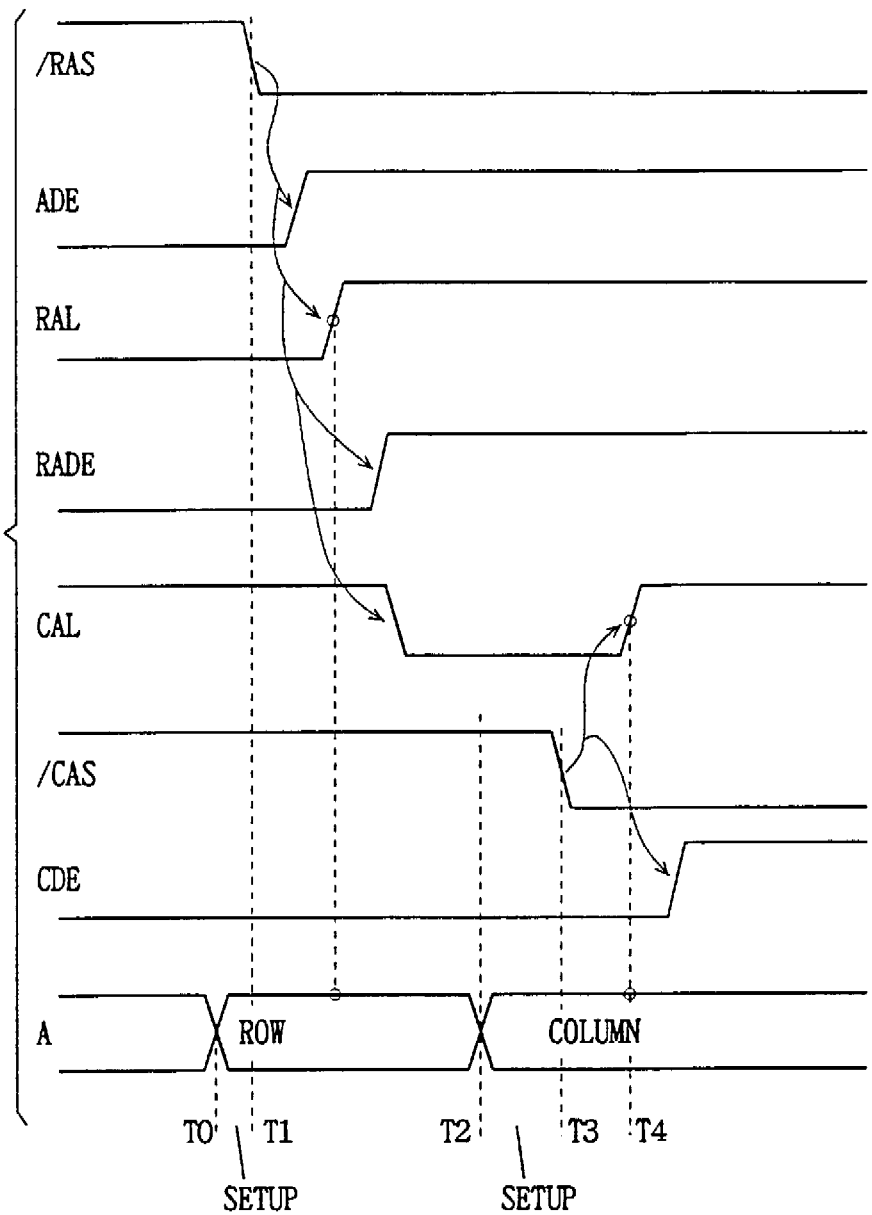

WITHIN ( ) :4K REFRESH

CSL : SELECTION OF 4 BIT LINE PAIRS
CA9,CA10 : SELECTION OF 1 BIT PAIR

4K REFRESH ; RA12 BEING DEGENERATED (1/16 DIVISION)

8K REFRESH (1/32 DIVISION)

SEMICONDUCTOR MEMORY DEVICE HAVING INTERNAL ADDRESS CONVERTING FUNCTION, WHOSE TEST AND LAYOUT ARE CONDUCTED EASILY

This application is a Divisional of application Ser. No. 08/756,505 filed Nov. 26, 1996, now U.S. Pat. No. 5,740,119.

BACKGROUND OF THE INVENTION

Field of the Invention

The present invention relates to semiconductor memory devices, particularly to an arrangement of a memory array and a peripheral circuit, and more particularly, to a configuration of a portion related to an address signal.

Description of the Background Art

FIG. 25 is a diagram showing an array arrangement and an allocation of address signals of a conventional 64 Mbit dynamic type semiconductor memory device. Referring to FIG. 25, the semiconductor memory device includes four memory planes M#0 to M#3 each having a plurality of memory cells arranged in rows and columns. Each of memory planes M#0 to M#3 is divided into 32 row blocks MRB0 to MRB31 and four column blocks MCB0 to MCB3. As will be described in detail later, each of row blocks MRB0 to MRB31 includes word lines extending in the row direction, and each of column blocks MCB0 to MCB3 includes column select lines extending in the column direction. Therefore, each of memory planes M#0 to M#3 includes 32·4 subarrays MB00 to MB313.

Memory planes M#0 to M#3 are specified by column address signal bits CA11, /CA11 and CA12, /CA12. In this specification and the drawings, the symbol "/" before a signal indicates a complementary signal. For example, memory plane M#0 is specified when both column address signal bits CA11 and /CA12 are at a logical high or H level. Memory plane M#1 is specified when both column address signal bits /CA11 and /CA12 are at the H level, memory plane M#2 is specified when both column address signal bits CA11 and CA12 are at the H level, and memory plane M#3 is specified when both column address signal bits /CA11 and CA12 are at the H level.

Each of memory planes M#0 to M#3 is divided into two global row blocks each including 16 row blocks. These global row blocks are specified by row address signal bits RA12 and /RA12. A global row block including row blocks MRB0 to MRB15 is specified when row address signal bit /RA12 is at the H level, and a global row block including row blocks MRB16 to MRB31 is specified when row address signal bit RA12 is at the H level.

FIG. 26 shows a more specific configuration of one memory plane and an allocation of addresses. Referring to FIG. 26, each of row blocks MRB0 to MRB31 includes 256 word lines WL. This word line WL extends in a row block MRBi (i=0 to 31), and connects memory cells of one row in a corresponding row block. Each of column blocks MCB0 to MCB3 includes 128 column select lines CSL. Column select line CSL brings four bit line pairs into a selected state simultaneously, as will be described later in detail. This column select line CSL extends in a column block MCBj (j=0 to 3). One row block MRBi includes memory cells of $256 \cdot 512 \cdot 4 = 2^9 \cdot 2^{10}$ bits, and memory plane M·k (k=0 to 3) includes memory cells of $32 \cdot 2^9 \cdot 2^{10} = 16$ Mbits.

Row address signal bits are allocated in the same way in the global row blocks (row blocks specified by row address signal bits RA12, /RA12). In FIG. 26, the allocation of row address signal bits to the global row block, or row blocks MRB0 to MRB15, selected when row address signal bit /RA12 is at the H level is shown. The row address signal bits are allocated to row blocks MRB16 to MRB31 similarly in the global row block specified by row address signal bit RA12.

Eight row blocks (MRB0 to MRB7 or MRB8 to MRB15) out of 16 row blocks are specified by row address signal bits RA11 and /RA11. Four out of these eight row blocks are specified by row address signal bits RA10 and /RA10. Although the allocation of row address signal bits to the row blocks specified by row address signal bit /RA11 is shown in FIG. 26, the row address signal bits are similarly allocated to the row blocks specified by row address signal bit RA11.

Among eight row blocks MRB0 to MRB7 (or MRB8 to MRB15) specified by row address signal bit /RA11 (or RA11), four row blocks are specified by row address signal bits RA10 and /RA10. More specifically, row blocks MRB0 to MRB3 are specified when row address signal bit /RA10 is at the H level, and row blocks MRB4 to MRB7 are specified when row address signal bit RA10 is at the H level. Among the row blocks specified by row address signal bits RA10 and /RA10, two row blocks are further specified by row address signal bits RA9 and /RA9. In FIG. 26, row blocks MRB0 and MRB1 are specified when row address signal bit /RA9 is at the H level, and row blocks MRB2 and MRB3 are specified when row address signal bit RA9 is at the H level.

Out of two row blocks specified by row address signal bits RA9 and /RA9, one row block is specified by row address signal bits RA8 and /RA8. More specifically, even-numbered row blocks are specified when row address signal bit /RA8 is at the H level, and odd-numbered row blocks are specified when row address signal bit RA8 is at the H level. Therefore, one row block is specified in one memory plane by row address signal bits RA8 to RA12 and /RA8 to /RA12.

One word line WL among 256 word lines included in a selected row block is specified by row address signal bits RA0 to RA7.

In the column blocks, two column blocks MCB0, MCB1 or MCB2, MCB3 are specified by column address signal bits CA8 and /CA8. More specifically, column blocks MCB0 and MCB1 are specified when column address signal bit CA8 is at the H level, and column blocks MCB2 and MCB3 are specified when column address signal bit /CA8 is at the H level.

One column block between these two specified column blocks is specified by column address signal bits CA7 and /CA7. Even-numbered column blocks MCB0 and MCB2 are specified when column address signal bit CA7 is at the H level, and odd-numbered column blocks MCB1 and MCB3 are specified when column address signal bit /CA7 is at the H level. In the specified column block, one of 128 column select lines CSL is selected by column address signal bits CA0 to CA6. This column select line CSL brings four bit line pairs into a selected state simultaneously, and one of these four bit line pairs is selected by column address signal bits CA9 and CA10.

FIG. 27A shows an arrangement of row blocks including refresh rows in a refresh operation of a semiconductor memory device having a 4K refresh cycle, and FIG. 27B shows an arrangement of row blocks including refresh rows of a semiconductor memory device having a 8K refresh cycle. The refresh rows indicate rows to which memory cells to be refreshed are connected or word lines specified according to a refresh address. The 4K refresh cycle means that the refresh operation should be conducted 4K times in order to refresh all the memory cells, and the 8K refresh cycle means that the refresh operation should be conducted 8K times in order to refresh all the memory cells. The refresh cycles are set by selective connection of bonding wires to pads or the like in a semiconductor memory device without structural change.

As shown in FIG. 27A, in the semiconductor memory device having the 4K refresh cycle, two row blocks (refresh rows) are brought into a selected state simultaneously in each of memory planes M#0 to M#3. In this state, both row address signal bits RA12 and /RA12 for specifying the global row blocks are brought into a selected state. In the following description, a state in which address signal bits complementary to each other are both brought into a selected state is referred to as "the address signal bits being degenerated." Therefore, in the refresh operation in this 4K refresh cycle, two of 32 row blocks are selected in each of memory planes M#0 to M#3 (1/16 division).

On the other hand, as shown in FIG. 27B, in the semiconductor memory device having the 8K refresh cycle, one row block (refresh row) is brought into a selected state in each of memory planes M#0 to M#3 in the refresh operation, and the refresh operation is carried out. In this case, in order to specify a global row block including refresh row blocks (refresh rows), row address signal bits RA12 and /RA12 are made valid: one is brought into a selected state, and the other is brought into a non-selected state. In the refresh operation in this 8K refresh cycle, one of 32 row blocks is brought into a selected state in each of memory planes M#0 to M#3 (1/32 division).

In the semiconductor memory device having the 8K refresh cycle, the number of word lines brought into a selected state simultaneously is small, and accordingly, charge/discharge of bit lines in the refresh operation is decreased, whereby the peak current is reduced. When the refresh cycle time is the same as that of 4K refresh cycle, the refresh operation is carried out 8K times, during which any normal accessing is not carried out. Therefore, the average current consumption during normal accessing is reduced. It is thus intended to reduce current consumption by changing the refresh cycle. By switching the refresh cycle by fixing a specific pad to a predetermined potential level by a bonding, for example, semiconductor memory devices having two kinds of refresh cycles can be implemented with the same configuration, whereby the manufacturing cost is reduced.

In the semiconductor memory device, a multi-bit test testing a plurality of memory cells simultaneously is conducted in order to shorten the test time. In this multi-bit test, the same data is written in a plurality of memory cells, data of these memory cells selected simultaneously are read out, and logical coincidence/non-coincidence of these read data is determined. If all of the plurality of memory cells simultaneously selected are normal, the read data are all the same in logic. On the other hand, if there is a defective memory cell, the read data are different in logic. By determining logical coincidence/non-coincidence of the read data, presence/absence of a defective memory cell is identified.

This multi-bit test is standardized in the semiconductor memory device, and address signal bits degenerated at this time are also standardized. In a 4K refresh device (semiconductor memory device), the degenerated address signal bits are five bits of CA9 to CA12 and RA12. On the other hand, in a 8K refresh device (semiconductor memory device), the degenerated address signal bits are five bits of column address signal bits CA8 to CA12.

FIG. 28A shows an arrangement of memory cells brought into a selected state in the multi-bit test of the 4K refresh device of the x4 configuration. As shown in FIG. 28A, in the multi-bit test mode, column address signal bits CA9 to CA12 and row address signal bit RA12 are degenerated. Since row address signal bit RA12 is degenerated, two word lines are selected in each of memory planes M#0 to M#3. Since column address signal bits CA8 and /CA8 are valid, two column groups are brought into a selected state in memory planes M#0 to M#3. FIG. 28A shows column blocks brought into a selected state when column address signal bit CA8 is at the H level. One column block is further selected by column address signal bit CA7, and in this selected column block, one column select line CSL is selected according to column address signal bits CA0 to CA6. Therefore, in each of memory planes M#0 to M#3, 8-bit memory cells are simultaneously selected (four bit line pairs are simultaneously selected by one column select line CSL).

Since column address signal bits CA11 and CA12 are degenerated, 8-bit memory cells selected in respective memory planes M#0 to M#3 are simultaneously selected, and 32-bit memory cells in total are transmitted to a multi-bit test circuit. The multi-bit test circuit determines pass/failure of the memory cells by determining logical coincidence/non-coincidence of data of the 32-bit memory cells.

In the semiconductor memory device of the x4 configuration inputting/outputting 4-bit data, two bits of an address signal are degenerated (ignored). In this case, the most significant address signal bits (great in the number) are usually degenerated (ignored). Therefore, in the semiconductor memory device of the x4 configuration having the 4K refresh cycle, address signal bits RA12 and CA12 are degenerated to input/output 4-bit data. In this case, as shown in FIG. 28A functionally, a first selector SEL1 further selects data of 8-bit memory cells from data of simultaneously selected 32-bit memory cells in accordance with column address signal bits CA9 and CA10 (selection of one of four bit line pairs), and then a second selector SEL2 selects data of 4-bit memory cells from data of 8-bit memory cells according to column address signal bit CA11. In this figure, first selector SEL1 and second selector SEL2 merely show the functional structure for transmitting memory cell data.

In this case, since data of 4-bit memory cells is selected according to column address signal bit CA11, two memory planes aligned in the horizontal direction of FIG. 28A are selected from memory planes M#0 to M#3. When column address signal bit CA11 is at the H level, for example, 2-bit memory cells are selected in each of memory planes M#0 and M#1 (selected memory cells are indicated by the mark ○). Since both row address signal bits /RA12 and RA12 are brought into a selected state, data of 1-bit memory cell is selected from each of two selected row blocks (selected word lines) in respective memory planes M#0 and M#1. As a result, 4-bit data DQ0 to DQ3 are read out.

On the other hand, in the semiconductor memory device having the 8K refresh cycle, column address signal bits CA8 to CA12 are degenerated. As shown in FIG. 28B, one row block is selected in each of memory planes M#0 to M#3, and 8-bit memory cells are selected from each of these selected row blocks. Data of these selected 32-bit memory cells in total are transmitted to the multi-bit test circuit for determination of logical coincidence/non-coincidence.

In the normal operation, first selector SEL1 further selects 8-bit memory cells from the selected 32-bit memory cells according to column address signal bits CA9 and CA10.

Column address signal bits CA9 and CA10 select one from four bit line pairs selected by one column select line CSL. Therefore, data is read out two bits from each of memory planes M#0 to M#3 by first selector SEL1. Then, second selector SEL2 selects 1-bit memory cell in each of memory planes M#0 to M#3 according to column address signal bit CA8. As a result, data of memory cells positioned in the same column block of the same row block in memory planes M#0 to M#3 are read out in parallel. Memory cells are selected in data writing similarly to the way in data reading.

Different address signal bits are degenerated in order to input/output 4-bit data in the 4K refresh cycle and in the 8K refresh cycle because of the following reason. In inputting and outputting multi-bit data most significant address signal bits are generally degenerated. In the semiconductor memory device having the 4K refresh cycle, row address signal bit RA12 is not used in the refresh operation. Therefore, row and column address signal bits RA12 and CA12 are brought into a degenerated state, and 4-bit data is input/output.

On the other hand, in the semiconductor memory device having the 8K refresh cycle, since row address signal bit RA12 is required in the refresh cycle, it cannot be degenerated. Therefore, column address signal bits CA11 and CA12 are degenerated. In multi-bit data such as x8 bit data and x16 bit data, address signal bits brought into a degenerated state for input/output of data are determined according to the similar rule. In the semiconductor memory device having the 8K refresh cycle, the column address signal bits are to be degenerated according to the number of bits of input/output data.

As described above, since a plurality of memory cells (32-bit memory cells) are simultaneously tested by the multi-bit test, the test time can be shortened. However, 32-bit memory cells selected in the multi-bit test are positioned differently in the 4K refresh device and in the 8K refresh device. Further, 4-bit memory cells selected simultaneously in the normal operation are positioned differently in the 4K refresh device and in the 8K refresh device. Therefore, data of memory cells selected internally are propagated through different propagation paths both in the test mode and in the normal operation mode, making it difficult to find correlation between the 4K refresh device and the 8K refresh device in evaluation of the device or the like (since different circuit portions operate in these refresh cycles). Therefore, in a laser trimming (LT) conducted for adjustment of an internal potential and programming of a defective memory cell address and a wafer level test (WT), the semiconductor device must be tested in the respective modes of the 4K refresh cycle and the 8K refresh cycle, resulting in the longer test time. Further, different programs are required for the respective refresh cycle modes, complicating the test procedure.

When storage capacity is increased in the semiconductor memory device, the number of address signal bits is accordingly increased, and the number of signal lines transmitting internal address signal bits is also increased. This causes increase in a charge/discharge current of the internal address signal lines.

When the number of internal address signal lines is increased, that is, when the number of the signal lines for transmitting the internal address signal bits to a plurality of memory planes is increased, interconnection lines are complicated and an area for the interconnection layout is increased, and also the layout becomes intricate.

Further, when four memory planes are arranged by parallel movement of the array arrangement (the allocation of row and column address signals) of one memory plane, even if an address buffer is arranged at the center of these four memory planes, the memory planes have different propagation delays of an address signal to the same row block (or the same column block), and operation characteristics of the memory planes (such as time required for a memory cell to be brought into a selected state and time required for accessing to the selected memory cell) are different, whereby the access time is increased (since the access time is determined based on the worst access time to the memory planes).

Further, the layout of the peripheral circuit must be conducted independently with respect to the respective memory planes, resulting in a longer time for layout design. In addition, the peripheral circuits must be arranged optimally in each memory plane in consideration of the propagation delay of an address signal and the like, resulting in more complicated layout design. Further, the operation characteristics of each memory plane must be measured independently, and an additional test for this purpose is required, resulting in a more complicated test process and longer test time.

SUMMARY OF THE INVENTION

One object of the present invention is to provide a semiconductor memory device having an address arrangement, with which a test and layout can be performed with ease and in a shorter time.

Another object of the present invention is to provide a semiconductor memory device having an address-related circuit which operates with lower power consumption and has more efficient layout.

A semiconductor memory device according to one aspect of the present invention includes: a memory array having a plurality of memory cells arranged in rows and columns, the memory cells of each row being connected to a word line; a refresh cycle specify signal generating circuit for generating a refresh cycle specify signal specifying one of first and second refresh cycle modes which in turn are different from each other in the number of word lines brought into a selected state during a refresh operation; and a selecting circuit for selecting a plurality of memory cells simultaneously from the memory array according to a multi-bit address signal having a predetermined number of address signal bits degenerated. The predetermined number of address signal bits include a first address signal bit degenerated when the first refresh cycle is specified and made valid when the second refresh cycle is specified in response to the refresh cycle specify signal, a second address signal bit made valid when the first refresh cycle is specified and degenerated when the second refresh cycle is specified, and a third address signal bit of at least one bit degenerated when any of the first and second refresh cycles is specified.

This semiconductor memory device further includes an address switching circuit for converting, when the first refresh cycle is specified, the first address signal bit to the second address signal bit, the second address signal bit to the third address signal bit, and the third address signal bit to the first address signal bit.

A semiconductor memory device according to another aspect of the present invention includes: a plurality of memory planes arranged separatedly from each other and each having a plurality of memory cells; an address input circuit receiving an externally applied address signal; an address buffer arranged at the center portion of the plurality of memory planes for receiving an address signal from the address input circuit to generate an internal address signal; a plurality of row predecoders arranged corresponding to each of said plurality of memory planes for predecoding an internal row address signal from the address buffer to transmit a predecoded signal to a corresponding memory plane in a first direction; a row decode circuit arranged corresponding to each of the plurality of memory planes for decoding a row predecoded signal from a corresponding row predecoder to select a memory cell row in a corresponding memory plane; a plurality of column predecoders provided for each of the plurality of memory planes for predecoding an internal address signal received from the address buffer to transmit an internal column predecoded signal to a plurality of corresponding memory planes in a second direction; and a column decode circuit provided corresponding to each of the memory planes for decoding a predecoded signal from a corresponding column predecoder to generate a column select signal for selecting a memory cell column in a corresponding memory plane.

A semiconductor memory device according to still another aspect of the present invention includes: a plurality of memory planes arranged being divided first and second center regions extending in first and second directions, each of the memory planes having a plurality of memory cells arranged in rows and columns; an address input circuit for receiving an external address signal to generate an internal address signal; a row specify signal generating/transmitting circuit coupled to the address input circuit for generating a row specify signal specifying a memory cell row from the internal address signal to transmit the generated row specify signal in the first direction in the first center region to each of the plurality of memory planes; a column specify signal generating/transmitting circuit coupled to the address input circuit for generating a column specify signal specifying a memory cell column from the internal address signal applied from the address input circuit to transmit the generated column specify signal in the second direction in the second center region to each of the plurality of memory planes; a row decode circuit arranged corresponding to each of the memory planes for receiving the row specify signal from the row specify signal generating/transmitting circuit to select a memory cell row in a corresponding memory plane; and a column decode circuit arranged corresponding to each of the plurality of memory planes for receiving and decoding the column specify signal from the column specify signal generating/specifying circuit to generate a signal selecting a memory cell column in a corresponding memory plane.

A semiconductor memory device according to a further aspect of the present invention includes: a plurality of memory planes arranged being divided by first and second center regions extending in first and second directions, each of the memory planes having a plurality of memory cells arranged in rows and columns; and a plurality of selecting circuits corresponding to each of the plurality of memory planes for selecting a memory cell in a corresponding memory plane in accordance with an applied address signal. The plurality of memory planes and the plurality of selecting circuits are arranged in mirror symmetry with respect to the first and second center regions.

By internally switching the address signal bits depending on the refresh cycle modes, memory cells at the same positions are always selected even in different refresh cycles without externally exchanging the address signal bits. Therefore, the test of the device becomes easy.

By predecoding the internal address signal for transmission to each memory plane, the number of signal lines charged/discharged can be decreased, resulting in reduction of current consumption.

By predecoding and transmitting the address signal, the scale of row decoder is reduced.

By transmitting the internal address signal (predecoded signal: row specify signal) in the first direction and the internal column address signal (predecoded signal: column specify signal) in the second direction, it is not necessary to arrange both the row address related signal propagation path and the column address related signal propagation path in the same direction, resulting in a shorter interconnection line length and a simplified and easy layout.

In an arrangement of the memory planes and the peripheral circuits in mirror symmetry with respect to the first and second center regions, one memory plane whose layout is optimized and whose operation characteristics are guaranteed can be folded back with respect to the first and second center regions, to implement a semiconductor memory device having a plurality of memory planes. Therefore, a semiconductor memory device whose operation characteristics are guaranteed is easily implemented, enabling an easy accommodation to change in design and/or specification.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram schematically showing a structure of a data input/output portion of the semiconductor memory device according to Embodiment 1 of the present invention.

FIG. 18 is a signal waveform diagram showing operation of the address switching circuit portion shown in FIG. 17.

DESCRIPTION OF THE PREFERRED EMBODIMENTS

[Embodiment 1]

Figure 1:
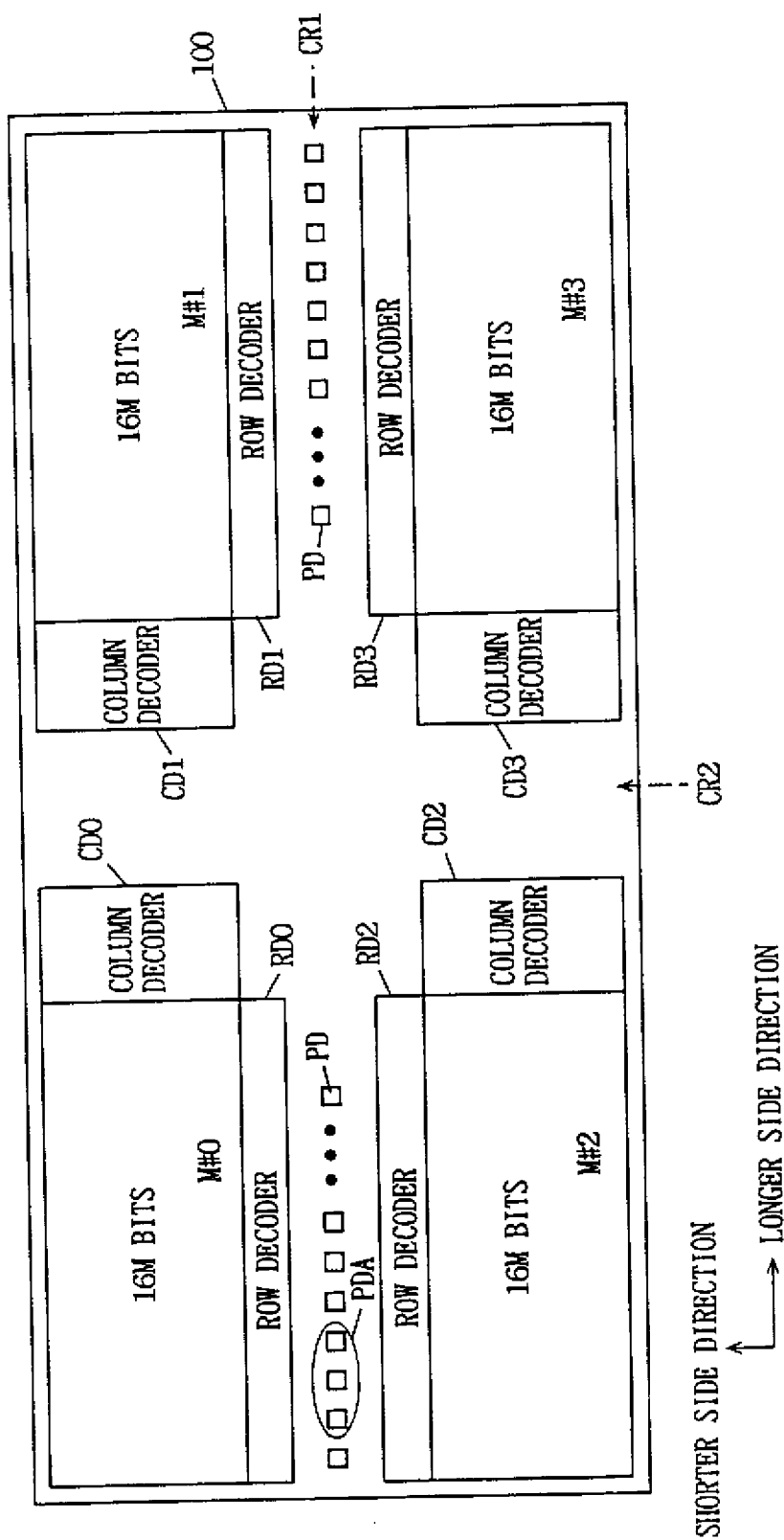
FIG. 1 is a diagram showing the whole layout of a semiconductor memory device according to Embodiment 1 of the present invention.

Referring to FIG. 1, a semiconductor memory device 1 includes four memory planes M#0 to M#3 separated from each other by center regions CR1 and CR2 extending in the longer side direction and the shorter side direction, respectively. Each of memory planes M#0 to M#3 has storage capacity of 16 Mbits as an example, and therefore, semiconductor memory device 1 has storage capacity of 64 Mbits. Memory planes M#0 to M#3 include row decoders RD0 to RD3 arranged extending in the longer side direction and facing to first center region CR1 and each selecting a word line (to be described later), and column decoders CD0 to CD3 arranged in the shorter side direction and facing to second center region CR2 to generate a column select signal. As will be described later, row decoders RD0 to RD3 are arranged in a mirror symmetry with respect to first and second center regions CR1 and CR2, and column decoders CD0 to CD3 are also arranged in mirror symmetry with respect to first and second center regions CR1 and CR2. Therefore, memory planes M#0 to M#3 are also arranged in mirror symmetry, and the allocation of addresses is also in mirror symmetry with respect to first and second center regions CR1 and CR2.

Pads PD are arranged in the longer side direction in first center region CR1. Address signal input pads PDA receiving an external address signal are arranged in first center region CR1 between memory planes M#0 and M#2.

Figure 2:
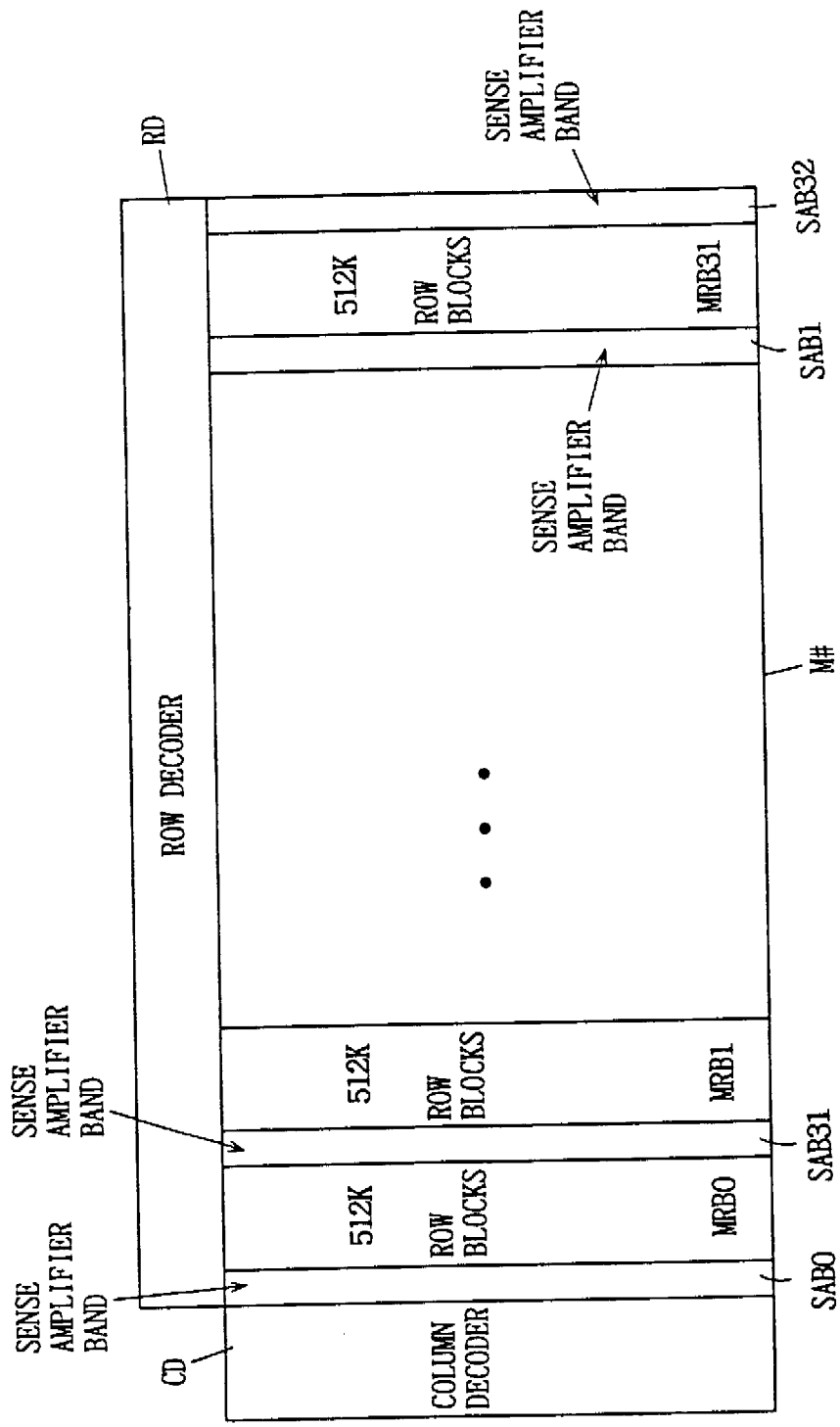
FIG. 2 is a diagram specifically showing a structure of one memory plane shown in FIG. 1.

Referring to FIG. 2, one memory plane M# includes 32 row blocks MRB0 to MRB31 each having 512-Kbit memory cells. In each of row blocks MRB0 to MRB31, 512-Kbit memory cells are arranged in a matrix of rows and columns. Sense amplifier bands SAB1 to SAB31 including sense amplifiers sensing and amplifying data of selected memory cells are arranged between respective row blocks MRB0 to MRB31. Sense amplifier bands SAB0 and SAB32 are further arranged outside row blocks MRB0 and MRB31, respectively. In one row block MRBi (i=0 to 31), data of memory cells connected to a selected row are sensed and amplified by sense amplifiers included in sense amplifier bands SABi and SAB(i+1) arranged on both sides. Therefore, sense amplifier bands SAB1 to SAB31 are shared by two row blocks.

Figure 3:
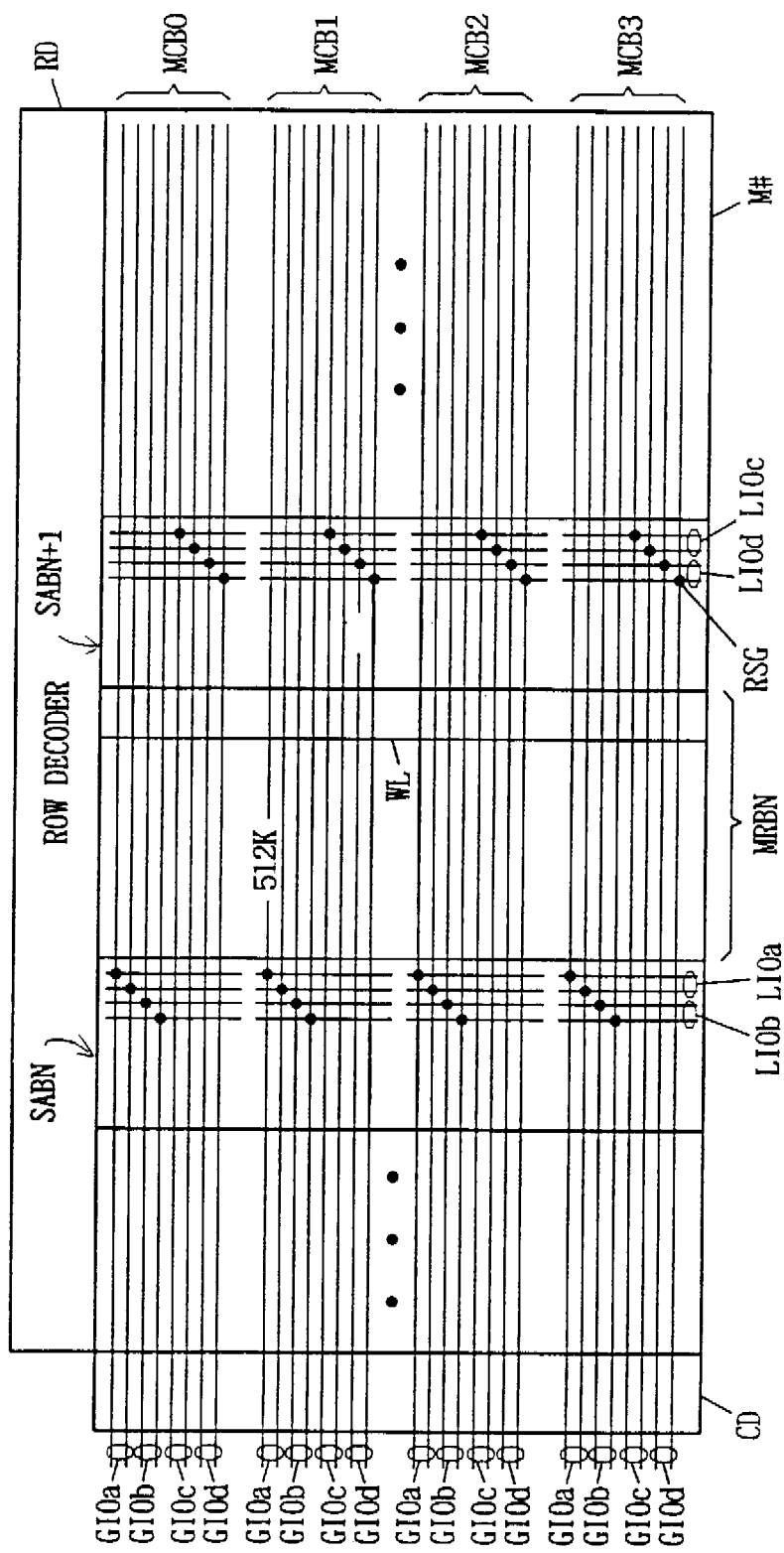
FIG. 3 is a diagram schematically showing an arrangement of global IO line pairs and local IO line pairs in one memory plane.

Referring to FIG. 3, memory plane M# is divided into four column blocks MCB0 to MCB3. Four global IO line pairs GIOa to GIOd are arranged in each of column blocks MCB0 to MCB3. These global IO line pairs GIOa to GIOd are arranged extending across all row blocks in the column extension direction in a corresponding column block. In each row block (a row block MRBN is representatively shown in FIG. 3), word line WL transmitting a row select signal from row decoder RD is arranged across column blocks MCB0 to MCB3. To this word line WL, connected are memory cells of one row, not shown.

Sense amplifier bands SABN and SABN+1 are arranged on both sides of row block MRBN in the column direction. In these sense amplifier bands SABN and SABN+1, local IO line pairs LIOa to LIOd are arranged extending in the row direction only in the corresponding column blocks. In each column block of row block MRBN, local IO line pairs LIOa, LIOb, and LIOc, LIOd are arranged. Four local IO line pairs in total are arranged for one row block. Local IO line pairs LIOa to LIOd are connected to global IO line pairs GIOa to GIOd arranged in a corresponding column block through row block select gates RSG indicated by solid circles in the figure. Row block select gate RSG is selected by a row address signal bit for row block selection, to be described later.

Figure 4:
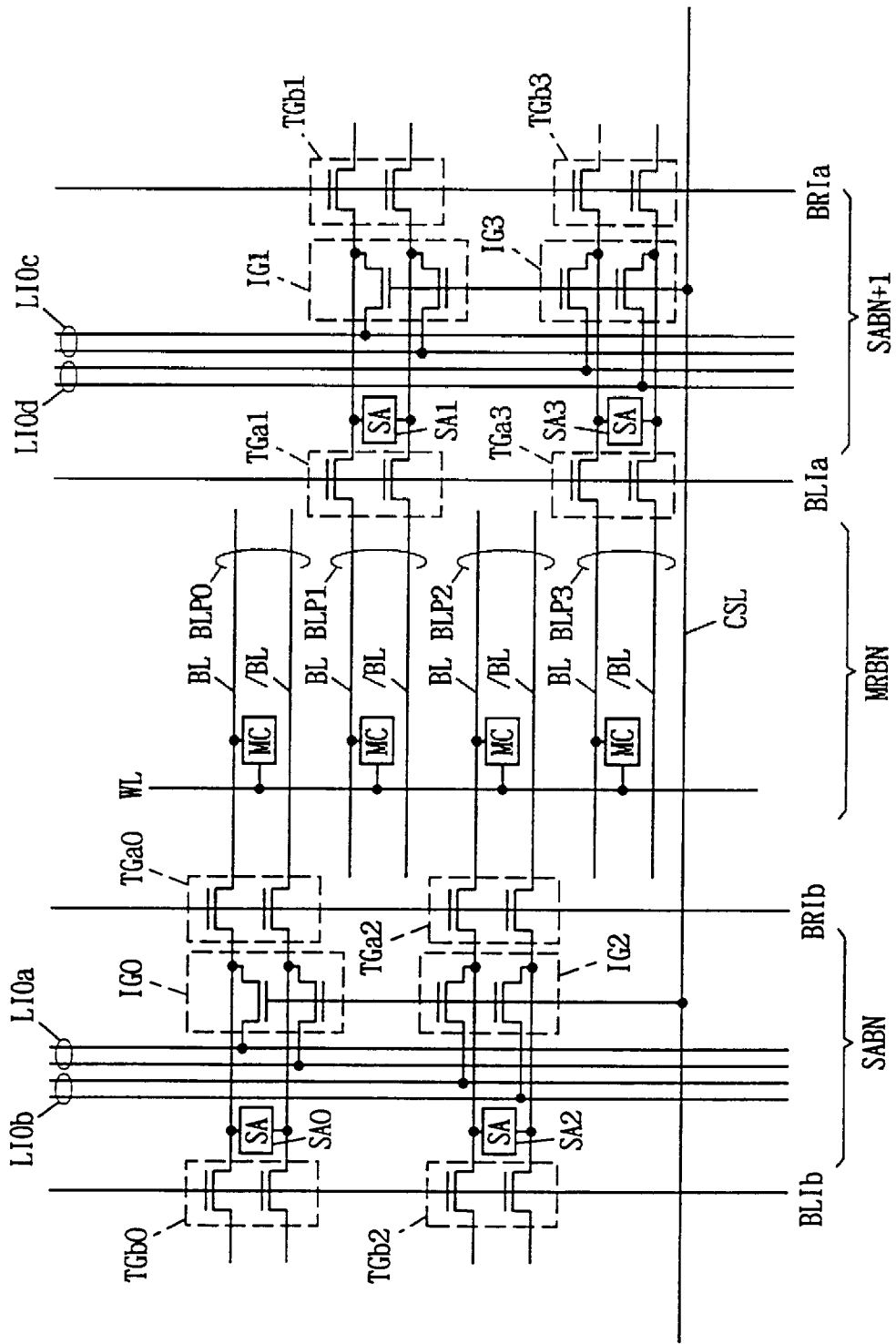
FIG. 4 is a diagram specifically showing an arrangement of sense amplifier bands shown in FIG. 3.

Referring to FIG. 4, the structure of a portion related to one column select line CSL is representatively shown. This column select line CSL extends over a plurality of row blocks in the column block of FIG. 3.

Only column select line CSL in a selected column block is brought into a selected state. Four bit line pairs BLP0 to BLP3 are arranged for one column select line CSL. Bit line pairs BLP0 to BLP3 each include bit lines BL and /BL transmitting data signals complementary to each other. Memory cells MC are arranged at crossing portions of bit line pairs BLP0 to BLP3 and word line WL. In FIG. 4, memory cells MC are arranged at crossing portions of bit lines BL and word line WL, as one example.

Bit line pairs BLP0 and BLP2 are connected to sense amplifiers SA0 and SA2 included in sense amplifier band SABN through isolation gates TGa0 and TGa2 rendered conductive in response to a bit line isolation control signal BRIb. Bit line pairs BLP1 and BLP3 are connected to sense amplifiers SA (SA1 and SA3) included in sense amplifier band SABN+1 through isolation gates TGa1 and TGa3 rendered conductive in response to a bit line isolation control signal BLIa. Sense amplifiers SA included in sense amplifier band SABN are connected to bit line pairs included in row block MRBN−1 through isolation gates TGb0 and TGb2 rendered conductive in response to bit line isolation control signal BLIb. Sense amplifiers SA included in sense amplifier band SABN+1 are connected to bit line pairs included in row block MRBN+1 through isolation gates TGb1 and TGb3 rendered conductive in response to bit line isolation control signal BRIa.

Sense amplifier SA is provided corresponding to each bit line pair, and shared by bit line pairs of adjacent row blocks. In one row block MRBN, sense amplifiers SA are alternately arranged on both sides of the bit line pairs. This sense amplifier arrangement is known as an "alternately arranged shared sense amplifier arrangement." In sense amplifier band SABN, local IO line pairs LIOa and LIOb are arranged in parallel with word line WL, and extends only in one column block. In sense amplifier band SABN+1, local IO line pairs LIOc and LIOd are arranged similarly.

Column select gates IG0 to IG3 rendered conductive in response to a signal potential on column select line CSL are provided for sense amplifiers SA0 to SA3. These column select gates IG0 to IG3 are rendered conductive when the signal potential on corresponding column select line CSL is at the H level indicating a selected state, and connects sense amplifiers SA0 to SA3 to local IO line pairs LIOa to LIOd. When row block MRBN is brought into a selected state, bit line isolation control signals BLIa and BRIb are brought to the H level, and bit line isolation control signals BRIa and BLIb are brought to the L level. Accordingly, bit line pairs BLP0 to BLP3 are connected to sense amplifiers SA0 to SA3, respectively.

In a standby cycle, bit line isolation control signals BLIa, BLIb, BRIa, and BRIb are all at the H level, and isolation gates TGa0 to TGa3 and TGb0 to TGb3 are all rendered conductive. By connecting only the selected row block to sense amplifiers SA, the capacitance of each of bit line pairs connected to sense amplifiers SA is reduced, to attain a high speed sensing operation and transmission of a sufficient read-out voltage (read-out data of memory cell) to a sense node. These local IO line pairs LIOa to LIOd are connected to global IO line pairs GIOa to GIOd (see FIG. 3) arranged in a corresponding column group, respectively. Detailed description will be given of the connection relationship between global IO line pairs and local IO line pairs later.

Figure 5:
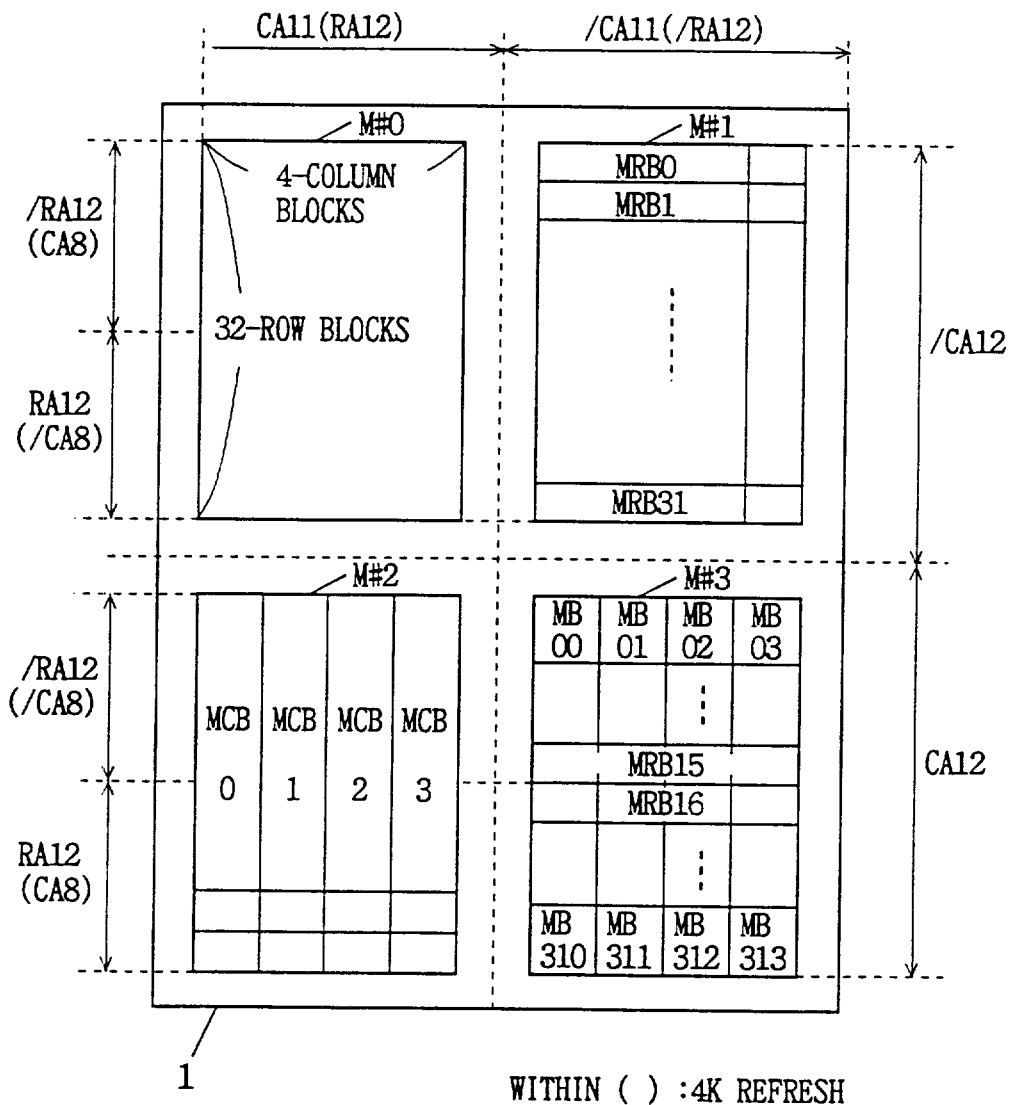
FIG. 5 is a diagram showing an allocation of address signal bits to the memory planes of the semiconductor memory device according to Embodiment 1 of the present invention.

Referring to FIG. 5, semiconductor memory device 1 includes four memory planes M#0 to M#3. Each of memory planes M#0 to M#3 is divided into 32 row blocks MRB0 to MRB31 and four column blocks MCB0 to MCB3. Different address signal bits specify the memory plane and the global row block having 16 row blocks in the 8K refresh cycle device and in the 4K refresh cycle device.

(A) 8K refresh cycle device:

A memory plane is specified by column address signal bits CA11, /CA11 and CA12, /CA12. When column address signal bit CA11 is at the H level, memory planes M#0 and M#2 are specified. When column address signal bit /CA11 at the H level, memory planes M#1 and M#3 are specified. When column address signal bit /CA12 is at the H level, memory planes M#0 and M#1 are specified, and when column address signal bit CA12 is at the H level, memory planes M#2 and M#3 are specified. Therefore, memory plane M#0, for example, is specified when both column address signal bits CA11 and /CA12 are at the H level.

In each of memory planes M#0 to M#3, row blocks MRB0 to MRB15 are specified by row address signal bit /RA12 at the H level, and row blocks MRB16 to MRB31 are specified by row address signal bit RA12 at the H level.

(B) 4K refresh cycle device:

The memory planes are specified by row address signal bits RA12, /RA12 and column address signal bits CA12, /CA12. The global row block including 16 row blocks is specified by column address signal bits CA8, /CA8. When column address signal bit /CA8 is at the H level, row blocks MRB0 to MRB15 are specified, and when column address signal bit CA8 is at the H level, row blocks MRB16 to MRB31 are specified.

Figure 6:
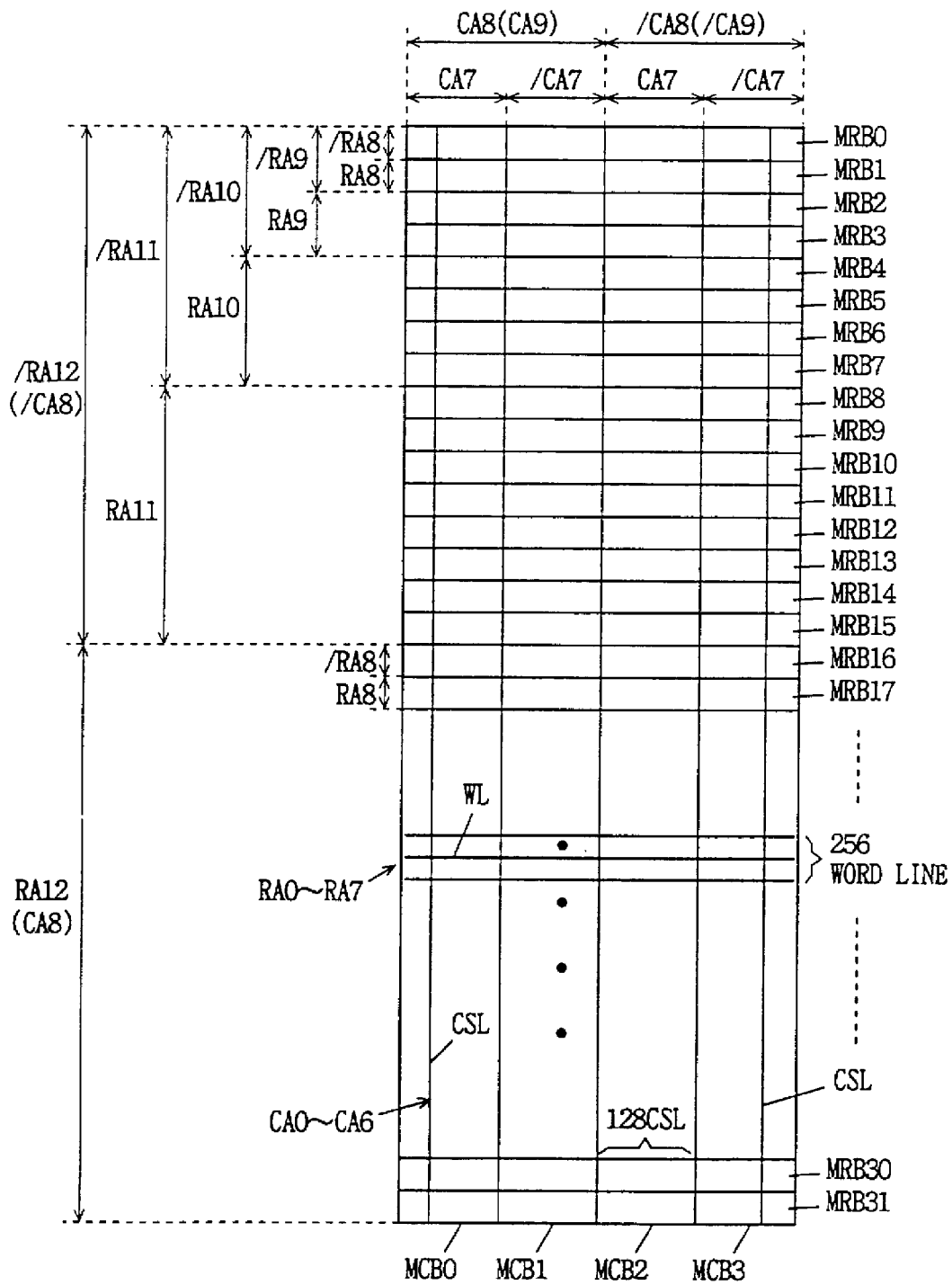
FIG. 6 is a diagram showing an allocation of addresses in the memory planes of the semiconductor memory device according to Embodiment 1 of the present invention.

Referring to FIG. 6, the allocation of address signal bits in one memory plane will be described. In the 4K refresh cycle device, two column blocks are specified by column address signal bits CA8, /CA8 and in the 8K refresh cycle device, two column blocks are specified by column address signal bits CA9 and /CA9. One of the specified two column blocks is specified by column address signal bits CA7, /CA7 in both devices.

One of 16 row blocks is specified by row address signal bits RA8, /RA8 to RA11, /RA11. In one row block, one of 256 word lines is specified according to row address signal bits RA0 to RA7. In one column block, one of 128 column select lines CSL is specified according to column address signal bits CA0 to CA6.

Because of one column select line CSL selecting four bit line pairs simultaneously, one of the four bit line pairs is selected according to column address signal bits CA9 and CA10 in the 8K refresh cycle device and according to column address signal bits CA10 and CA11 in the 4K refresh cycle device. Selection of memory cells according to the address allocation shown in FIGS. 5 and 6 will now be described.

Referring to FIG. 7, four local IO line pairs LIOa to LIOd provided for four column blocks MCB0 to MCB3 in one row block of one memory plane M# are connected to corresponding global IO line pairs GIOa through GIOd through row block select gate RSG rendered conductive in response to a row block select signal φR. Accordingly, in one row block, four local IO line pairs LIOa to LIOd of column blocks MCB0 to MCB3 are connected to corresponding global IO line pairs GIOa to GIOd. A selecting circuit 10 is provided in common for four global IO line pairs GIOa to GIOd of respective column groups MCB0 to MCB3. Selecting circuit 10 selects global IO line pairs in even-numbered column blocks or odd-numbered column blocks according to column address signal bits CA7, /CA7. Accordingly, global IO line pairs GIOa to GIOd in two column groups are selected to be connected to internal data buses DSa0 to DSd0 and DSa1 to DSd1. Eight-bit memory cells are selected by selecting circuit 10.

A selecting circuit 12 is provided for internal data buses DSa0 to DSd1. Selecting circuit 12 selects data of one internal data bus and couples the same to the outside of the device according to three column address signal bits (bits CA8, CA9, and CA10 in the 8K refresh device: bits CA9, CA10, and CA11 in the 4K refresh device). Accordingly, 1-bit memory cell is selected and accessed as to one memory plane.

In the multi-bit test, data of 8-bit memory cells selected by selecting circuit 10 are applied to a multi-bit test circuit 15 in parallel. Multi-bit test circuit 15 receives data of 8-bit memory cells from each of four memory planes M#0 to M#3. Therefore, logical coincidence/non-coincidence of data of 32-bit memory cells is determined by multi-bit test circuit 15, and a pass/fail signal P/ZF indicating the determination result is provided. This pass/fail signal P/ZF may be provided to the outside of the device through a special pin terminal or read out to the outside of the device through a data input/output circuit via a path, not shown.

As shown in FIG. 7, such a structure as selecting one of odd-numbered and even-numbered column groups in selecting circuit 10 both in the 4K refresh device and in the 8K refresh device is implemented by switching of address signals according to a refresh cycle mode shown in FIGS. 5 and 6. Description will be given hereinafter of selection of memory cells in the multi-bit test operation and in the normal operation in each refresh cycle mode.

Figure 8A:
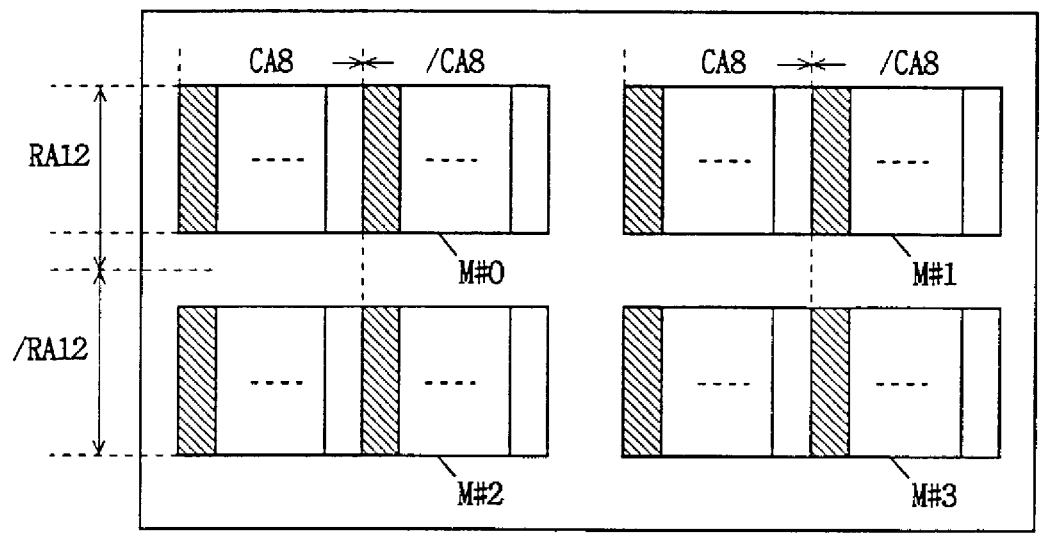
FIGS. 8A and 8B are diagrams showing an arrangement of selected row blocks and an allocation of address signal bits in the refresh operation according to Embodiment 1 of the present invention.

(A) Refresh operation:

(a) 4K refresh;

Referring to FIG. 8A, in the 4K refresh device, row address signal bits RA12 and /RA12 are used for specifying two memory planes. When row address signal bit RA12 is at the H level, memory planes M#0 and M#1 are specified, and when row address signal bit /RA12 is at the H level, memory planes M#2 and M#3 are specified. In each of memory planes M#0 to M#3, the global row block including 16 row blocks is specified by column address signal bits CA8, /CA8.

Since row address signal bit RA12 is brought into a degenerated state in the refresh operation, memory planes M#0 to M#3 are all specified. Column address signal bits CA8, /CA8 are not used for row selection in the refresh operation. Therefore, two row blocks are brought into a selected state in each of memory planes M#0 to M#3. Accordingly, in the 4K refresh cycle device, in each of memory planes M#0 to M#3, the 1/16 division operation is implemented in which two of 32 row blocks are refreshed.

Figure 8B:
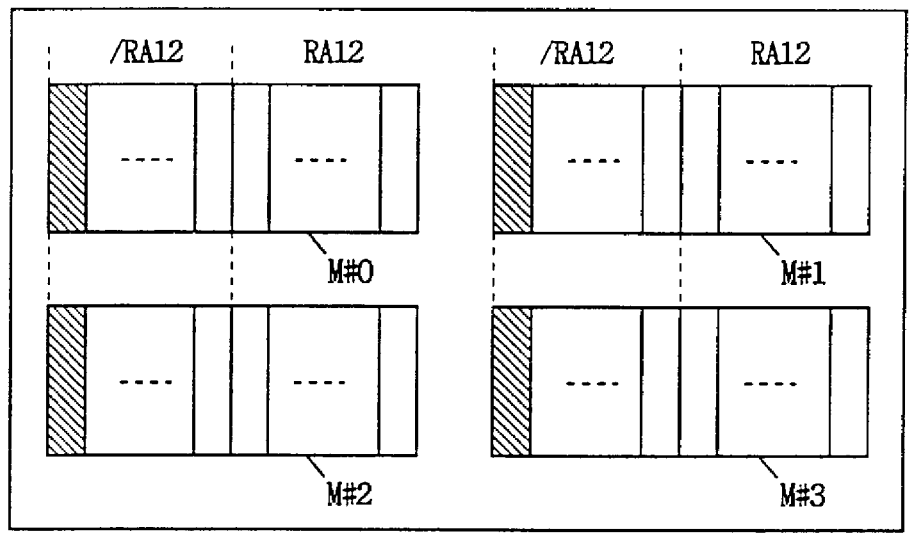

(b) 8K refresh;

Referring to FIG. 8B, in the 8K refresh cycle device, row address signal bits RA12, /RA12 are used for specifying the global row block in each of memory planes M#0 to M#3. Row address signal bits RA12, /RA12 are not degenerated and are valid, and one global row block is brought into a selected state in each of memory planes M#0 to M#3. Therefore, in each of memory planes M#0 to M#3, one row block is selected and refreshed according to row address signal bits RA8 to RA11, /RA8 to /RA11. Accordingly, in each of memory planes M#0 to M#3, the 1/32 division operation is implemented in which one of 32 row blocks is refreshed.

(B) Multi-bit test and normal access mode:

(a) 8K refresh cycle device

Figure 9:
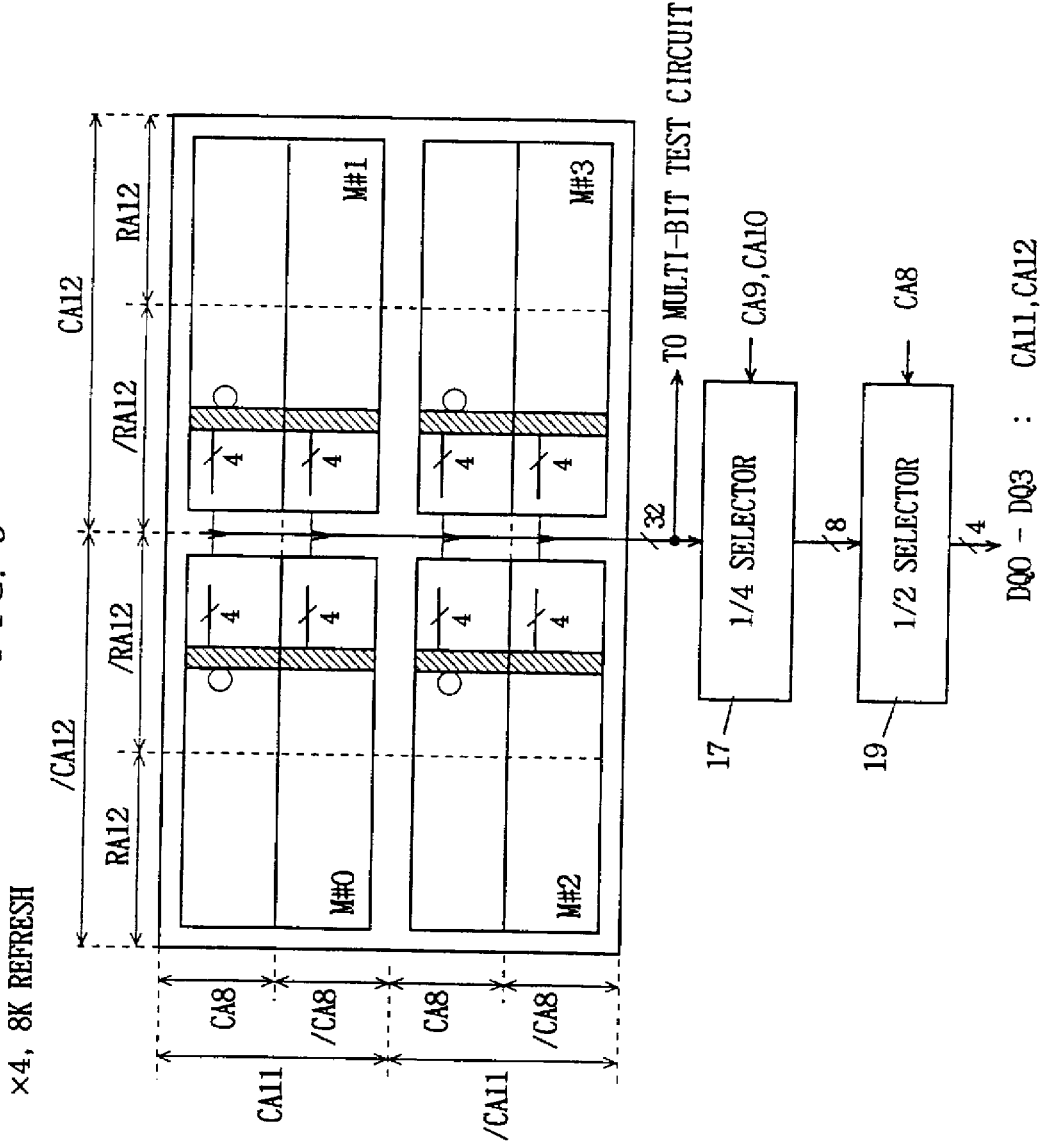
FIG. 9 is a diagram showing a manner of selection of degenerated address signal bits and memory cells in a 8K refresh cycle device according to Embodiment 1 of the present invention.

As shown in FIG. 9, the memory planes are specified by column address signal bits CA11, /CA11, CA12, and /CA12 in the 8K refresh cycle device. In each of memory planes M#0 to M#3, the global row block is specified by row address signal bits RA12, /RA12. Two column blocks are specified by column address signal bits CA8, /CA8.

In the multi-bit test, column address signal bits CA8 to CA12 are degenerated. In the multi-bit test, one global row block is specified by valid row address signal bits RA12, /RA12, and one row block is brought into a selected state in each of memory planes M#0 to M#3 by row address signal bits RA11 to RA8, /RA11 to /RA8.

Since column address signal bits CA8 and /CA8 are brought into a degenerated state, two column blocks (odd-numbered column blocks or even-numbered column blocks specified by column address signal bits CA7, /CA7) are selected in the row block. In the selected column block, one column select line CSL is brought into a selected state by a column decoder, and 4-bit memory cells are selected. In each of memory planes M#0 to M#3, 8-bit memory cells are selected, and data of the selected memory cells are read out. This read out data of 32-bit memory cells is applied to the multi-bit test circuit (see FIG. 7) for determination of logical coincidence/non-coincidence.

In the normal access mode, 4-bit memory cells are further selected from 32-bit memory cells simultaneously selected in the multi-bit test (in the case of the x4 configuration). In this case, data of 4-bit memory cells is selected by a ¼ selector 17 and a ½ selector 19 corresponding to selecting circuit 12 shown in FIG. 7 for outputting. ¼ selector 17 selects one of four bit line pairs related to one column select line according to column address signal bits CA9 and CA10. Accordingly, 1-bit memory cell is selected from two column blocks brought into a selected state in the respective memory planes M#0 to M#3.

Then, ½ selector 19 further selects 4-bit memory cells from the selected 8-bit memory cells according to column address signal bit CA8. When column address signal bit CA8 is at the H level, for example, data of the memory cells of column blocks positioned on the upper side of memory planes M#0 to M#3 in the perpendicular direction in the figure is selected (indicated by circles). ¼ selector 17 and ½ selector 19 are shown selecting memory cells according to column address signal bits merely functionally. These selectors may include a preamplifier and the like. Alternatively, ½ selector 19 may first select 16-bit memory cells from 32-bit memory cells and then, ¼ selector 17 may select 4-bit memory cells from 16-bit memory cells. Also in this case, the same address signal bits are used.

(b) 4K refresh cycle device

Figure 10:
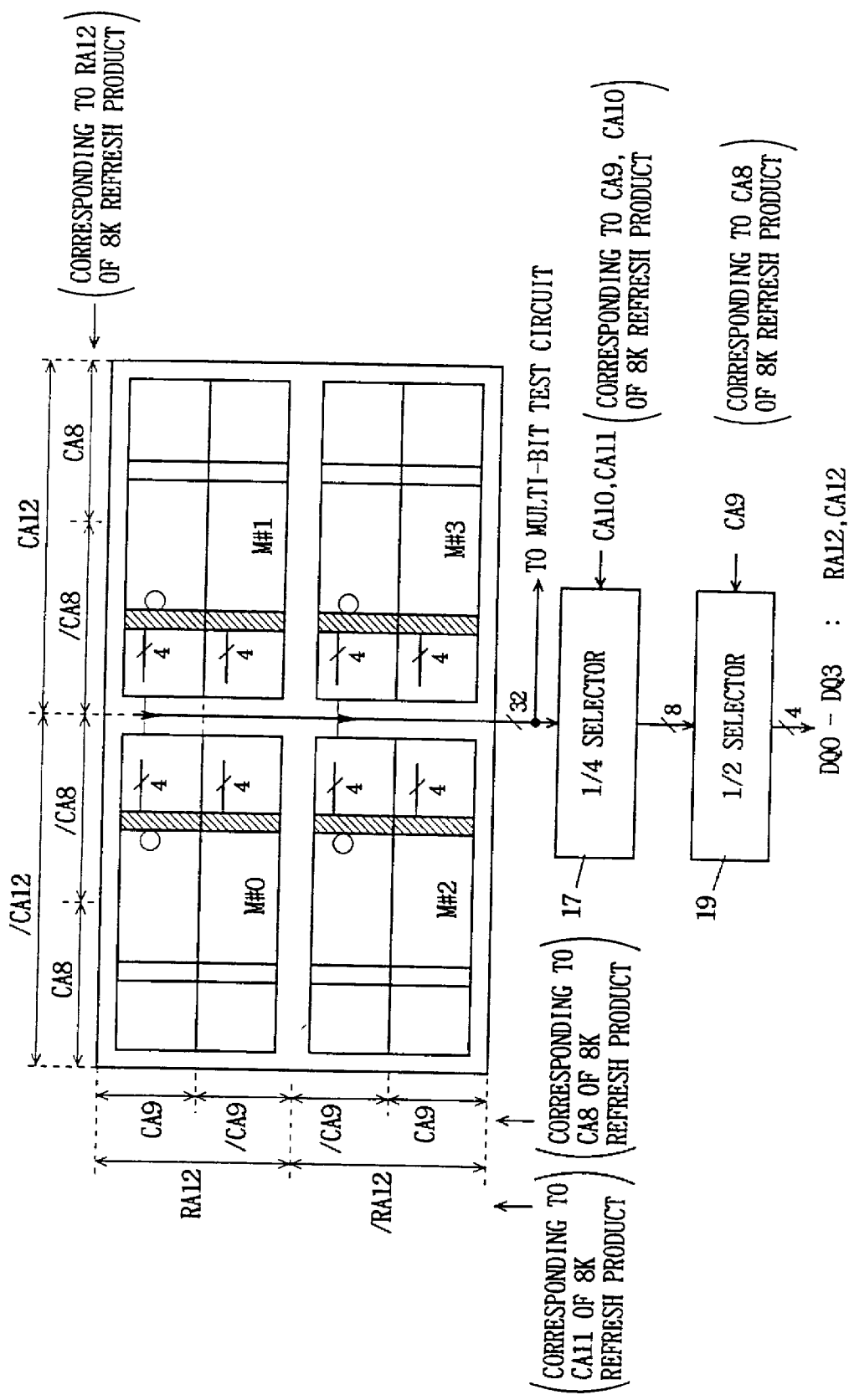
FIG. 10 is a diagram showing an arrangement of degenerated address bits and selected memory cells in a 4K refresh cycle device according to Embodiment 1 of the present invention.

Referring to FIG. 10, in the 4K refresh cycle device, address signal bits RA12 and CA12 are brought into a degenerated state in order to output 4-bit data DQ0 to DQ3. These address signal bits RA12 and CA12 are used for specifying memory planes M#0 to M#3. Therefore, memory planes M#0 to M#3 are always brought into a selected state.

The global row block is specified by column address signal bits CA8, /CA8. Two column blocks are specified according to column address signal bits CA9 and /CA9. One of four bit line pairs related to one column select line CSL is selected by column address signal bits CA10 and CA11.

In the multi-bit test mode, column address signal bits CA9 to CA12 and RA12 are degenerated. Therefore, since address signal bit CA8 is not degenerated but valid, one global row block is selected in each of memory planes M#0 to M#3. Row blocks included in the selected global row block are selected according to row address signal bits RA11 to RA8. Since address signal bit CA9 is brought into a degenerated state, two column blocks are selected and data of 8-bit memory cells are read out from each of memory planes M#0 to M#3. Therefore, data of 32-bit memory cells are read out in parallel to be applied to the multi-bit test circuit. In the multi-bit test mode, memory cells of column and row blocks at the same position as in the 8K refresh cycle device shown in FIG. 9 are selected.

In the normal access mode, 4-bit memory cells are further selected by ¼ selector 17 and ½ selector 19 from 32-bit memory cells brought into a selected state simultaneously in the multi-bit test mode. In the 4K refresh cycle device, ¼ selector 17 selects one of four bit line pairs according to column address signal bits CA10 and CA11, and ½ selector 19 selects one of two column blocks (even-numbered column blocks or odd-numbered column blocks) according to column address signal bit CA9. Therefore, both in the multi-bit test mode and in the normal access mode, memory cells at the same positions as in the 8K refresh cycle device shown in FIG. 9 are selected.

Both in the normal mode and in the test mode, selecting circuit 10 selects global IO line pairs according to column address signals CA7, /CA7 as shown in FIG. 7 both in the 4K refresh cycle device and in the 8K refresh cycle device. Therefore, the same data propagation path is formed both in the 4K refresh cycle device and in the 8K refresh cycle device. The selecting circuit and a preamplifier and the like for the data propagation path, not shown, operate similarly in these devices, making it easy to establish the correlation between these devices when they are evaluated.

In the laser trimming (LT) and the wafer test (WT), the device has only to be tested in either the 4K refresh cycle mode or the 8K refresh cycle mode, resulting in substantial reduction of the test time. Further, only a test program for one of the refresh cycle modes is required, facilitating the test.

Figure 11:
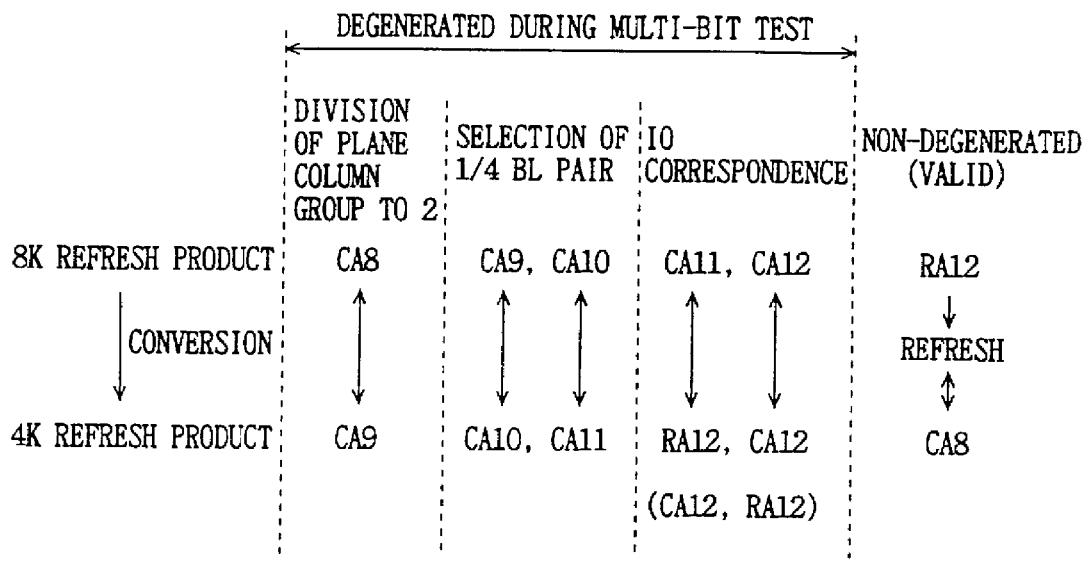
FIG. 11 is a diagram showing an address switching manner according to Embodiment 1 of the present invention.

FIG. 11 shows address switching between the 8K refresh cycle device and the 4K refresh cycle device. Referring to FIG. 11, in the 8K refresh cycle device, address signal bits CA8 to CA12 are degenerated in the multi-bit test operation. Row address signal bit RA 12 is non-degenerated (valid) for use in the refresh operation. On the other hand, in the 4K refresh cycle device, address signal bits RA12 and CA9 to CA12 are degenerated in the multi-bit test operation. In the 8K refresh cycle device, address signal bit RA12 is switched to address signal bit CA8, and column address signal bits CA8 to CA10 are shifted by one bit to be switched to address signal bits CA9 to CA11, respectively. Column address signal bit CA11 is switched to row address signal bit RA12. Column address signal bit CA12 is not changed. By this switching of address signal bits, the same memory cells can be selected for accessing or for multi-bit test both in the 8K refresh cycle device and in the 4K refresh cycle device, since the same address signal bits are degenerated and the same address signal bits are non-degenerated internally when the same external address signal is applied.

Address signal bits CA11 and CA12 corresponding to IO (input/output data bit) in the 8K refresh cycle device may be switched to address signal bits CA12 and RA12 for the 4K refresh cycle device, respectively as shown in the parentheses in FIG. 11. In this case, column address signal bits are sequentially shifted, and the row address signal bit may be switched to the most significant column address signal bit position. Also in such switching, the memory cells at the same positions are selected in the case of the x4-bit configuration (since the degenerated address signal bits corresponding to IO specify the memory plane, and all memory planes are specified in the case of the x4-bit configuration (in both refresh cycle devices)).

In this switching of address signal bits, either device may be used as a reference device for switching. More specifically, address conversion may be carried out at switching from the 4K refresh cycle device to the 8K refresh cycle device and vice versa.

In the above described Embodiment 1, a semiconductor memory device of the x4-bit configuration is shown. However, memory cells of the same position are selected by similar address switching even in the configuration for inputting/outputting data of x8 bits and x16 bits. It is sufficient to correlate the more significant address signal bits to each IO. In the case of the x8-bit configuration, by making column signal bits CA10 to CA12 corresponding to IO, a semiconductor memory device of the x8-bit configuration having the 8K refresh cycle is obtained, and by making address signal bits CA11, CA12 and RA12 corresponding to IO, a semiconductor memory device of the x8 bit configuration having the 4K refresh cycle is obtained. Conversion of address signal bits is the same. In this case, by exchanging positions of ¼ selector 17 and ½ selector 19 shown in FIGS. 9 and 10, 8-bit memory cells can easily be brought into a selected state simultaneously in the x8 bit configuration. Further, by this positional exchange, 16-bit memory cells can be selected similarly in the x16 bit configuration.

Figure 12A:
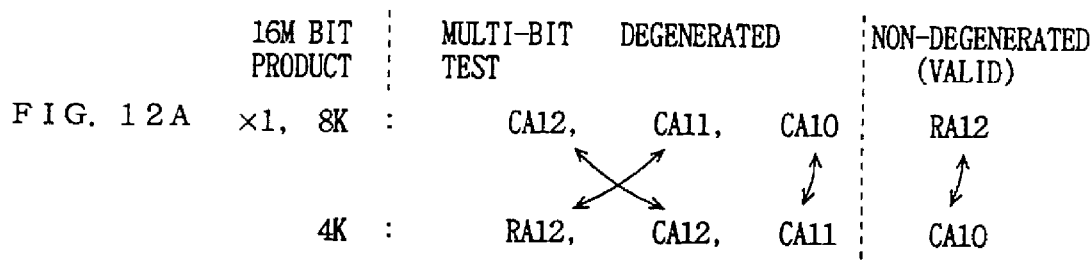
FIGS. 12A and 12B are diagrams showing the address switching manner in a modification of Embodiment 1 of the present invention.
Figure 12B:

FIGS. 12A and 12B show how addresses are switched in a 16 M-bit semiconductor memory device. FIG. 12A illustrates switching of address signal bits between the 8K and 4K refresh cycle semiconductor memory devices of the x1-bit configuration. Referring to FIG. 12A, address signal bits CA10 to CA12 are degenerated and address signal bit RA12 is non-degenerated in the multi-bit test operation in the 8K refresh cycle device. In the 4K refresh cycle device, address signal bits CA11, CA12, and RA12 are degenerated and address signal bit CA10 is non-degenerated in the multi-bit test operation. In this case, if the 8K refresh cycle device is used as a reference, address signal bit RA12 in the 8K refresh cycle device is switched to address signal bit CA10 in the 4K refresh cycle device, and address signal bits CA10 to CA12 in the 8K refresh cycle device are switched to address signal bits CA10, RA12, and CA12 in the 4K refresh cycle device. As a result, memory cells at the same positions can be selected in both devices in the multi-bit test operation and the normal access operation.

FIG. 12B illustrates how addresses are switched in the 16 M-bit semiconductor device of the x4-bit configuration. Referring to FIG. 12B, external address signal bits CA12 and RA12 (corresponding to IO) are not used in the case of the x4-bit configuration. The refresh cycle includes 4K and 2K refresh cycles. Address signal bit CA10 and CA11 are degenerated in the 4K refresh cycle device, and address signal bits CA11 and RA11 are degenerated in the 2K refresh cycle device. Address signal bit RA11 is non-degenerated in the 4K refresh cycle device, and address signal bit CA10 is non-degenerated in the 2K refresh cycle device. In this case, if the 4K refresh cycle device is used as a reference, address signal bit RA11 in the 4K refresh cycle device is switched to address signal bit CA10 in the 2K refresh cycle device, and address signal bits CA10 and CA11 in the 4K refresh cycle device are switched to address signal bits CA11 and RA11 in the 2K refresh cycle device. As a result, the same memory cells can be brought into a selected state in both devices in the multi-bit test operation and the normal access operation.

In this switching, address signal bit CA10 in the 4K refresh cycle device may be switched to address signal bit RA11 in the 2K refresh cycle device, and address signal CA11 in the 4K refresh cycle device may be used as address signal bit CA11 in the 2K refresh cycle device.

Figure 13A:
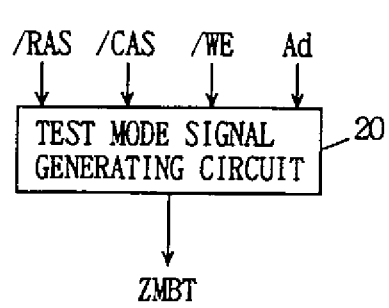
FIG. 13A is a diagram schematically showing a structure of a test mode signal generating circuit.

Referring to FIG. 13A, a test mode signal generating circuit 20 receives externally applied control signals, that is, a row address strobe signal /RAS, a column address strobe signal /CAS, a write enable signal /WE, and a specific address signal bit Ad to bring a multi-bit test mode instruct signal ZMBT to the L level in an active state. Test mode signal generating circuit 20 determines that the multi-bit test mode is specified when a so-called WCBR condition (/WE, /CAS before/RAS: signals /WE and /CAS are brought into an active state at the L level before the fall of the signal /RAS) is satisfied and the address signal bit Ad indicates a specific logic value, and brings multi-bit test mode instruct signal ZMBT into an active state. Address signal bit Ad may not only function as a so-called address key set to a specific state, but also specify a test mode when a voltage satisfying a super Vcc condition or higher than power supply voltage Vcc used in the normal operation is applied.

Alternatively, test mode signal generating circuit 20 may receive a special test mode specify signal specifying the test mode directly from an outside world.

Figure 13B:
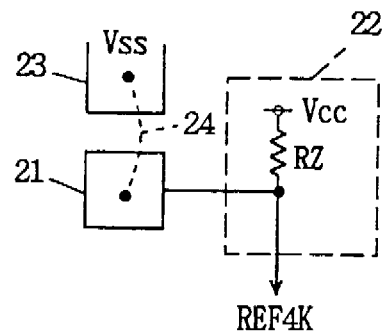
FIG. 13B is a diagram schematically showing a structure for generating a refresh cycle mode specify signal.

Referring to FIG. 13B, a signal generating circuit 22 is provided which generates a refresh cycle mode specify signal REF4K indicating the 4K refresh cycle in response to the potential on a pad 21. Signal generating circuit 22 includes a resistance element RZ of high resistance connected between the output node and a power supply node as one example. Pad 21 is connected to a lead frame (external pin terminal) 23 transmitting ground potential Vss through a bonding wire 24. When pad 21 is connected to lead frame 23 by bonding wire 24, refresh cycle mode specify signal REF4K is brought to the L level at the ground potential level, indicating that the 8K refresh cycle mode is specified. When bonding wire 24 is not provided, refresh cycle mode specify signal REF4K is brought to the H level, indicating that the 4K refresh cycle mode is specified.

Alternatively, a fuse program in which the potential level of signal REF4K is set using a fuse element (link element) may be used in the structure of signal generating circuit 22.

Figure 14:
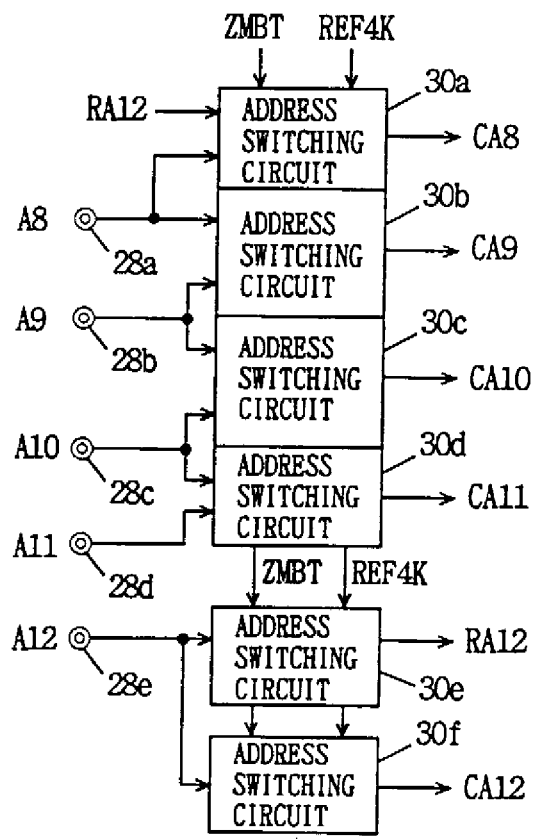
FIG. 14 is a diagram schematically showing a circuit structure for switching addresses in Embodiment 1 of the present invention.

FIG. 14 shows the structure of an address switching portion for internally switching address signal bits. Referring to FIG. 14, address signal switching circuits 30a to 30f are provided for address signal input terminals 28a to 28e receiving externally applied address signal bits A8 to A12. These address switching circuits 30a to 30f degenerate their output signals when test mode instruct signal ZMBT is activated, and switches signal propagation paths according to refresh cycle mode specify signal REF4K.

Address switching circuit 30a receives external address signal bit A8 and internal row address signal bit RA12 to generate column address signal bit CA8. Address switching circuit 30b receives external address signal bits A8 and A9 to transmit one of them as internal column address signal CA9. Address switching circuit 30c receives external address signal bits A9 and A10 to output one of them as internal column address signal bit CA10. Address switching circuit 30d outputs one of external address signal bits A10 and A11 as internal column address signal bit CA11. Address switching circuit 30e receives external address signal bit A12 to generate internal row address signal bit RA12. Address switching circuit 30f receives external address signal bit A12 to generate internal column address signal bit CA12. Therefore, address switching circuit 30f does not switch column address signal bits, but functions just as a column address buffer for bit CA12.

Figure 15:
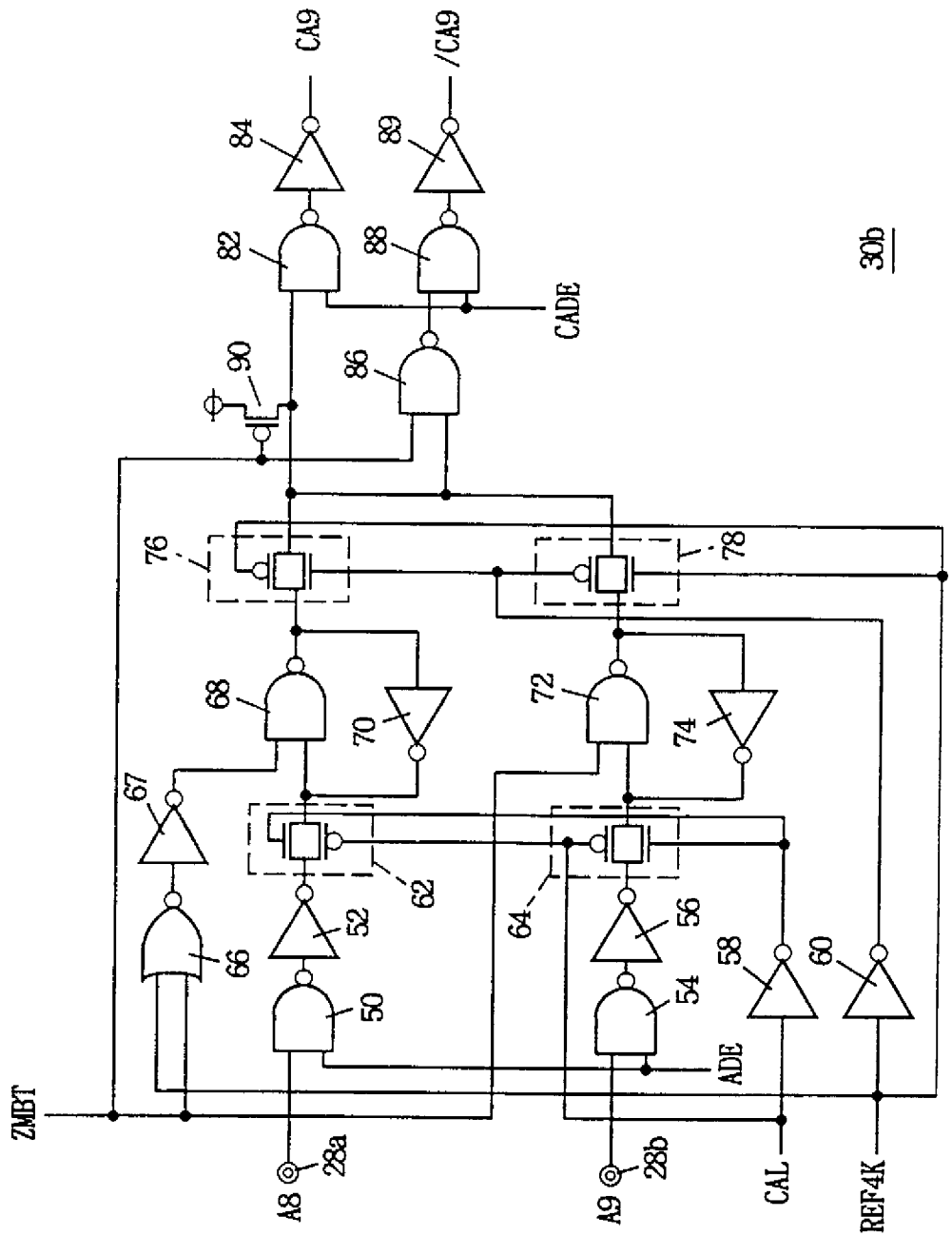
FIG. 15 is a diagram specifically showing the structure of the address switching circuit shown in FIG. 14.

Referring to FIG. 15, a specific arrangement of address switching circuit 30b in FIG. 14 is representatively shown. In address switching circuit 30b shown in FIG. 15, a column address buffer includes a function of switching address signal bits internally.

Referring to FIG. 15, address switching circuit 30b includes an NAND gate 50 receiving externally applied address signal bit A8 and a buffer activate signal ADE, an inverter 52 receiving the output signal of NAND gate 50, an NAND gate 54 receiving address signal bit A9 and buffer activate signal ADE, an inverter 56 receiving the output signal of NAND gate 54, an inverter 58 receiving a column address latch enable signal CAL, an inverter 60 receiving refresh cycle mode specify signal REF4K, a CMOS transmission gate 62 rendered conductive when the output signal of inverter 58 is at the H level for passing the output signal of inverter 52 therethrough, a CMOS transmission gate 64 rendered conductive when the output signal of inverter 58 is at the H level for passing the output signal of inverter 56 therethrough, an NOR gate 66 receiving refresh cycle mode specify signal REF4K and test mode instruct signal ZMBT, an inverter 67 receiving the output signal of NOR gate 66, an NAND gate 68 having one input receiving the output signal of inverter 67 and the other input receiving an output signal from CMOS transmission gate 62, an inverter 70 inverting the output signal of NAND gate 68 to transmit the inverted signal to the other input of NAND gate 68, an NAND gate 72 having one input receiving test mode instruct signal ZMBT and the other input receiving a signal transmitted through CMOS transmission gate 64, an inverter 74 inverting the output signal of NAND gate 72 to transmit the inverted signal to the other input of NAND gate 72, a CMOS transmission gate 76 rendered conductive when refresh cycle mode instruct signal REF4K is at the L level for passing the output signal of NAND gate 68 therethrough, a CMOS transmission gate 78 rendered conductive when refresh cycle mode instruct signal REF4K is at the H level for passing the output signal of NAND gate 72 therethrough, an NAND gate 82 having one input receiving a signal applied through CMOS transmission gate 76 and the other input receiving a column address decoder enable signal CADE, an inverter 84 inverting the output signal of NAND gate 82 to generate internal column address signal bit CA9, an NAND gate 86 receiving test mode instruct signal ZMBT and a signal applied through CMOS transmission gates 76 and 78, an NAND gate 88 receiving the output signal of NAND gate 86 and column address decoder enable signal CADE, an inverter 89 inverting the output signal of NAND gate 88 to generate internal column address signal bit /CA9, and a p channel MOS transistor 90 rendered conductive in response to test mode instruct signal ZMBT for charging one input of NAND gate 82 to the power supply potential level.

Test mode instruct signal ZMBT is brought into an active state at the L level when the multi-bit test mode is specified. Refresh cycle mode specify signal REF4K is brought to the H level when specifying the 4K refresh cycle. NAND gate 68 and inverter 70 configure a latch circuit, and NAND circuit 72 and inverter 74 configure another latch circuit. CMOS transmission gates 76 and 78 function as a selector for selecting one of externally applied address signal bits A8 and A9 according to refresh cycle mode specify signal REF4K. NAND gate 50 and inverter 52 constitute the input initial stage for address signal bit A8, and NAND gate 54 and inverter 56 constitute the input initial stage for address signal bit A9. The remaining components constitute a column address buffer for column address signal bit A9. Operation of address switching circuit 30b shown in FIG. 15 will now be described with reference to the operation waveform diagram shown in FIG. 16.

Refresh cycle mode specify signal REF4K is selectively fixed at the H level or the L level. In the 4K refresh cycle device, signal REF4K is fixed at the H level, and in the 8K refresh cycle device, signal REF4K is fixed at the L level. Operation of the 4K refresh cycle device and the 8K refresh cycle device will be described hereinafter in this order.

(i) 4K refresh cycle device:

In the 4K refresh cycle device, signal REF4K is at the H level, CMOS transmission gate 76 is rendered nonconductive, and CMOS transistor 78 is rendered conductive. NOR gate 66 outputs a signal at the L level according to signal REF4K at the H level and accordingly, inverter 67 outputs a signal at the H level and NAND gate 68 functions as an inverter.

Figure 16:
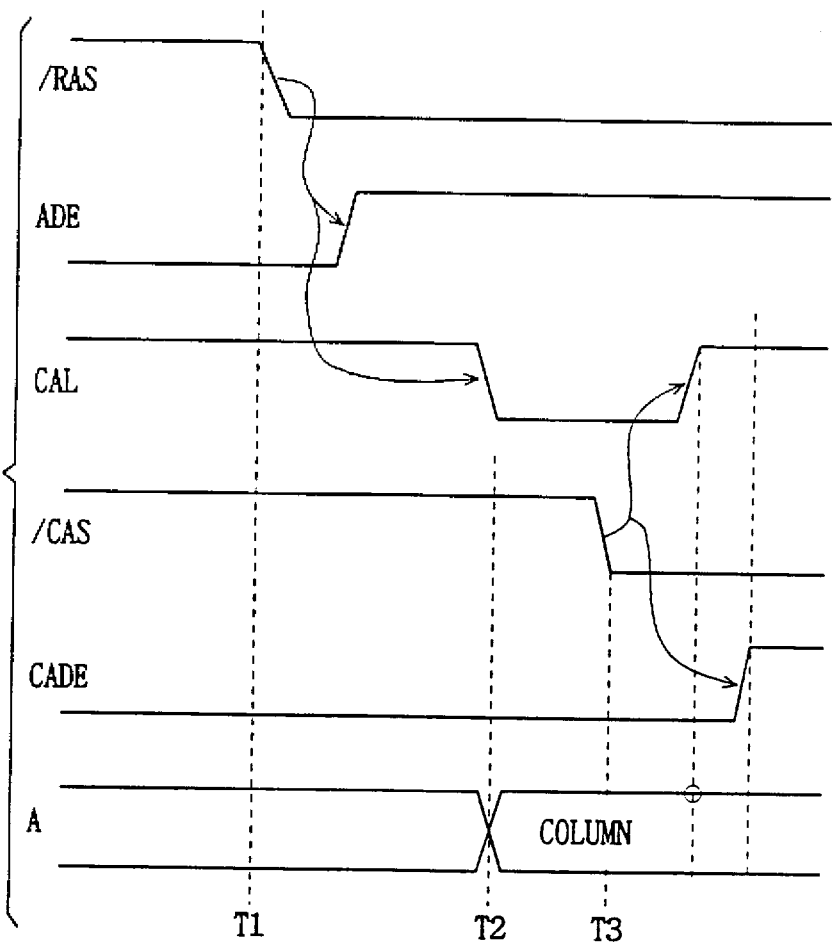
FIG. 16 is a signal waveform diagram showing operation of the address switching circuit shown in FIG. 15.

As shown in FIG. 16, when row address strobe signal /RAS is at the H level before time T1, signal ADE is at the L level in a non-active state, and NAND gates 50 and 54 output a signal at the H level irrespective of the values of external address signal bits A8 and A9. Latch enable signal CAL is at the H level, and CMOS transmission gates 62 and 64 are conductive to allow signals applied from inverters 52 and 56 to pass therethrough.

In response to row address strobe signal /RAS being brought to an active state at the L level at time T1, signal ADE is brought to the H level, and NAND gates 50 and 54 function as inverters to invert external address signal bits A8 and A9, respectively, and to apply the inverted signals to inverters 52 and 56. In this state, latch enable signal CAL is still at the H level, and CMOS transmission gates 62 and 64 remain non-conductive.

After a predetermined time, column address latch enable signal CAL falls to the L level (after RAS-CAS delay time), external address signal bits A8 and A9 are set as column address signal bits, and external address signal bits A8 and A9 are transmitted as column address signal bits through CMOS transmission gates 62 and 64 rendered conductive in response to column address latch enable signal CAL at the L level. The address signal bits transmitted to CMOS transmission gates 62 and 64 are held by NAND gate 68 and inverter 70 and NAND gate 72 and inverter 74, respectively. Note that test mode instruct signal ZMBT is at the H level, and that NAND gates 68 and 72 function as inverters in the normal operation mode.

In response to the falling of column address strobe signal /CAS to the L level at time T3, column address latch enable signal CAL rises to the H level, CMOS transmission gates 62 and 64 are rendered non-conductive, and external address signal bits A8 and A9 are latched.

Since CMOS transmission gate 78 is conductive, the output signal of NAND gate 72 is applied to NAND gates 82 and 86. NAND gate 86 now functions as an inverter. Therefore, NAND gates 82 and 88 receive address signal bits complementary to each other at their respective one inputs.

After a predetermined time from the falling of column address strobe signal /CAS to the L level (after the rising of latch enable signal CAL to the H level), control signal CADE is brought to the H level, NAND gates 82 and 88 function as inverters, and internal column address signal bits CA9 and /CA9 complementary to each other are generated from external address signal bit A9 for output.

In the test operation mode, test mode instruct signal ZMBT is brought to the L level, the output signal of NAND gate 72 is fixed at the H level, and the output signal of NAND gate 86 is fixed at the H level. Further, MOS transistor 90 is rendered conductive, and a signal at the H level is applied to NAND gate 82. Therefore, in the multi-bit test mode, in response to the rising of control signal CADE to the H level, both NAND gates 82 and 88 output a signal at the L level, and accordingly, internal column address signal bits CA9 and /CA9 are both brought to the H level, and both are brought into a selected state (degenerated).

(ii) 8K refresh cycle device:

In the 8K refresh cycle device, refresh cycle mode specify signal REF4K is set at the L level. In this state, CMOS transmission gate 78 is rendered non-conductive, and CMOS transmission gate 76 is rendered conductive. Since signal REF4K is at the L level, OR gate 66 functions as an inverter, and accordingly, OR gate 66 and inverter 67 constitute a buffer circuit. Therefore, in the normal operation, test mode instruct signal ZMBT is at the H level and NAND gate 68 functions as an inverter. As in the case of address signal bit A9, external address signal bit A8 is, after latched by NAND gate 68 and inverter 70, transmitted to NAND gates 82 and 86, as shown in the waveform diagram of FIG. 16. When control signal CADE is brought into an active state at the H level, internal column address signal bits CA9 and /CA9 are generated according to this externally applied address signal bit A8.

In the multi-bit test mode, since test mode instruct signal ZMBT is at the L level, the output signal of OR gate 66 is brought to the H level, and the output signal of inverter 67 is brought to the L level. Accordingly, the output signal of NAND gate 68 is brought to the H level, and the output signal of NAND gate 86 is also brought to the H level. Therefore, also in this state, internal column address signal bits CA9 and /CA9 are both brought into a degenerated state at the H level in the multi-bit test mode in response to activation of the signal CADE.

As described above, the address switching circuit shown in FIG. 15 switches addresses in the column address buffer portion. When the 8K refresh cycle is specified, external address signal bit A8 is converted into internal column address signal bit CA9, and in the 4K refresh cycle device, external address signal bit A9 is selected as internal column address signal bit CA9. Address signal bits are switched with the 4K refresh cycle device as a reference.

Figure 17B:
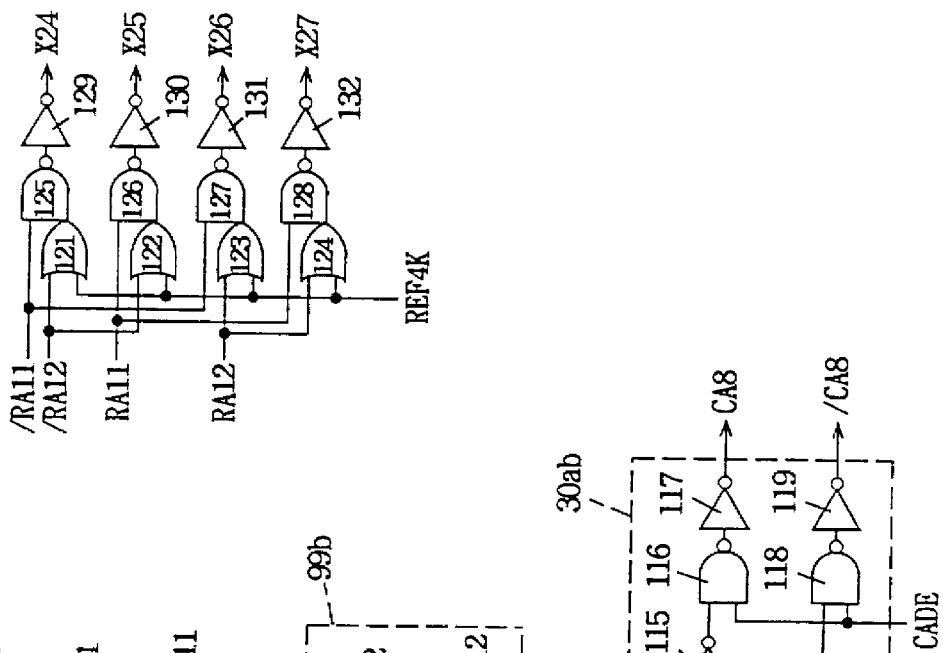
FIGS. 17A and 17B are diagrams schematically showing a structure of an address switching circuit portion for switching a row address signal bit and a column address signal bit according to Embodiment 1 of the present invention.
Figure 17A:
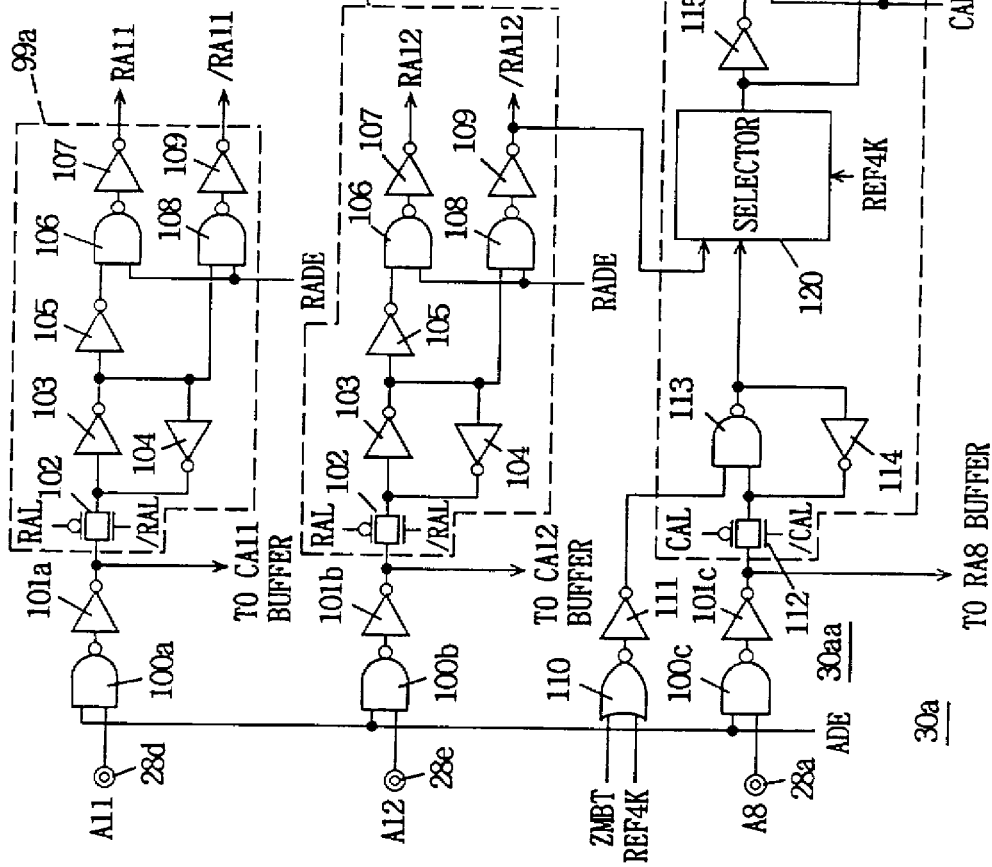

FIG. 17A shows the structure of a portion of address switching circuit 30a shown in FIG. 14. FIG. 17A also shows the structure of the row address buffer portion generating internal row address signal bits RA11, /RA11 and RA12, /RA12 from external address signal bits A11 and A12.

Referring to FIG. 17A, an NAND gate 100a receiving an address buffer enable signal ADE and external address signal bit A11 and an inverter 101a receiving the output signal of NAND gate 100a are provided for external address signal input terminal 28d. NAND gate 100a and inverter 101a constitute an address signal input initial stage, and are shared by row and column address buffers.

A row address buffer 99a generates internal row address signal bits RA11 and /RA11 according to an address signal applied from inverter 101a. Row address buffer 99a includes a CMOS transmission gate 102 rendered conductive in response to the L level of a row address latch enable signal RAL, an inverter 103 inverting an address signal bit applied through CMOS transmission gate 102, an inverter 104 inverting the output signal of inverter 103 to transmit the inverted signal to the input portion of inverter 103, an inverter 105 receiving the output signal of inverter 103, an NAND gate 106 receiving the output signal of inverter 105 and row address decode enable signal RADE, an inverter 107 receiving the output signal of NAND gate 106, an NAND gate 108 receiving the output signal of inverter 103 and row address decode enable signal RADE, and an inverter 109 receiving the output signal of NAND gate 108.

Internal row address signal bit RA11 is output from inverter 107, and internal row address signal bit /RA11 is output from inverter 109. Inverters 103 and 104 constitute a latch circuit. Row address latch enable signal RAL is brought to the L level when row address strobe signal /RAS is at the H level, and to the H level in response to the L level of row address strobe signal /RAS. Accordingly, row address buffer 99a is in a latching state.

An NAND gate 100b and an inverter 101b constituting the input initial stage are provided for external address input terminal 28e receiving external address signal bit A12. NAND gate 100b receives address buffer enable signal ADE and external address signal bit A12. Inverter 101b receives the output signal of NAND gate 100b and inverts the same. Inverter 101b applies the inverted signal to row address buffer 99b and a column address buffer (not shown) which in turn generates column address signal bit CA12. Since row address buffer 99b has the same configuration as row address buffer 99a, the corresponding portions are labeled with the same reference characters. Internal row address signal bits RA12 and /RA12 are generated from row address buffer 99b.

Address switching circuit 30a switching internal row address signal bit RA12 to column address signal bit CA8 in the 8K refresh cycle includes an input initial stage 30aa provided for address input terminal 28a receiving external address signal bit A8, and a column address buffer 30ab selecting one of the output signal of input initial stage 30aa and internal row address signal bit /RA12 from row address buffer 99b according to the refresh cycle mode to generate internal column address signals bits CA8 and /CA8. Input initial stage 30aa includes an NAND gate 100c receiving address buffer enable signal ADE and external address signal bit A8 and an inverter 101c receiving the output signal of NAND gate 100c. The output signal of inverter 101c is applied to column address buffer 30ab and also to the row address buffer generating row address signal bit RA8.

In order to control an operation of column address buffer 30ab, address switching circuit 30a further includes an NOR gate 110 receiving test mode instruct signal ZMBT and refresh cycle mode specify signal REF4K, and an inverter 111 receiving the output signal of NOR gate 110. When the 4K refresh cycle mode is specified, the output signal of NOR gate 110 is brought to the L level, and the output signal of inverter 111 is fixed at the H level both in the normal operation mode and in the test operation mode. On the other hand, when the 8K refresh cycle mode is specified by refresh cycle mode specify signal REF4K, NOR gate 110 functions as an inverter to invert test mode instruct signal ZMBT, and accordingly, a signal corresponding to test mode instruct signal ZMBT is provided from inverter 111.

Column address buffer 30ab includes a CMOS transmission gate 112 rendered conductive when column address latch enable signal CAL is at the L level, an NAND gate 113 having one input receiving the output signal of inverter 111 and the other input receiving a signal from CMOS transmission gate 112, an inverter 114 receiving and inverting the output signal of NAND gate 113 to transmit the inverted signal to the other input of NAND gate 113, a selector 120 selectively passing one of the output signal of NAND gate 113 and internal row address signal bit /RA12 according to refresh cycle specify signal REF4K, an inverter 115 receiving the output signal of selector 120, an NAND gate 116 receiving the output signal of inverter 115 and column address decoder enable signal CADE, an inverter 117 receiving the output signal of NAND gate 116, an NAND gate 118 receiving a signal from selector 120 and column address decoder enable signal CADE, and an inverter 119 receiving the output signal of NAND gate 118.

Column address signal bit CA8 is output from inverter 117, and column address signal bit /CA8 is output from inverter 119. When refresh cycle mode specify signal REF4K is at the H level and specifies the 4K refresh cycle, selector 120 selects signal A8 applied from NAND gate 113. On the other hand, when refresh cycle mode specify signal REF4K is at the L level and specifies the 8K refresh cycle, selector 120 selects internal row address signal bit /RA12. Therefore, in the 4K refresh cycle, externally applied address signal bit A8 corresponds to internal column address signal bit CA8. In the 8K refresh cycle, internal (external) row address signal bit /RA12 corresponds to internal column address signal bit /CA8.

FIG. 17B shows the structure of a row predecoder predecoding row address signal bits RA11 and RA12. Referring to FIG. 17B, the row predecoder includes OR gates 121 and 122 each receiving row address signal bit /RA12, and OR gates 123 and 124 each receiving row address signal bit RA12. OR gates 121 to 124 receive refresh cycle mode specify signal REF4K at the respective other inputs. NAND gates 125 to 128 are provided corresponding to OR gates 121 and 124, respectively. NAND gate 125 receives the output signal of OR gate 121 and row address signal bit /RA11. NAND gate 126 receives the output signal of OR gate 122 and row address signal bit /RA11. NAND gate 127 receives the output signal of OR gate 123 and row address signal bit /RA11. NAND gate 128 receives row address signal bit RA11 and the output signal of OR gate 124. The set of OR gate and NAND gate constitute an OR/NAND composite gate.

Inverters 129 to 132 are provided receiving the respective output signals of NAND gates 125 to 128. Row predecoded signals X24 to X27 are provided from these inverters 129 to 132.

In the 4K refresh cycle mode, signal REF4K is at the H level, and the output signals of OR gates 121 to 124 are all set at the H level. Accordingly, both row address signal bits RA12 and /RA12 are regarded as the H level and degenerated. In the 8K refresh cycle mode, signal REF4K is at the L level, and row address signal bit RA12 is made valid. Description will now be given of operation of the address switching circuit shown in FIG. 17A with reference to the operation waveform diagram shown in FIG. 18.

Before time T0, row address strobe signal /RAS is at the H level, and row address latch enable signal RAL is at the L level. Therefore, in row address buffers 99a and 99b, CMOS transmission gate 102 is conductive. Address buffer enable signal ADE is at the L level, and NAND gates 100a to 100c all output a signal at the H level.

Before the falling of signal /RAS at time T1, an externally applied address signal is set as a row address signal at time T0. A time (T1 to T0) required for setting this address signal bit as a row address signal bit is called a setup time. When signal /RAS falls to the L level, buffer enable signal ADE is then brought to the H level, and NAND circuits 100a to 100c are enabled to operate as inverters. As a result, externally applied address signal bits A11 and A12 are entered through CMOS transmission gate 102 in row address buffers 99a and 99b. On the other hand, column address latch enable signal CAL is still at the H level, and CMOS transmission gate 112 in column address buffer 30ab is in an off state. After a predetermined time, row address latch enable signal RAL is brought to the H level to render CMOS transmission gate 102 non-conductive, and externally applied address signals A11 and A12 are latched in row address buffers 99a and 99b. Then, row address decode enable signal RADE is brought into an active state at the H level, NAND gates 106 and 108 are enabled, and complementary internal row address signal bits RA11, /RA11 and RA12, /RA12 are generated according to the latched row address signal bit.

After a predetermined time from the falling of row address strobe signal /RAS, column latch enable signal CAL is then brought to the L level, and CMOS transmission gate 112 in column address buffer 30ab is rendered conductive. At time T2, an externally applied address signal is switched from a row address signal to a column address signal, and at time T3, column address strobe signal /CAS is brought into an active state at the L level. In response to the falling of column address strobe signal /CAS, column address latch enable signal CAL is brought to the H level at time T4 to render CMOS transmission gate 112 non-conductive, and externally applied row address signal bit A8 is latched in column address buffer 30ab.

When refresh cycle mode specify signal REF4K is at the H level, the 4K refresh cycle mode is specified, and NAND gate 113 functions as an inverter. According to refresh cycle mode specify signal REF4K at the H level, selector 120 selects column address signal bit A8 applied from NAND gate 113. In response to the falling of address strobe signal /CAS, column decoder enable signal CADE is brought into an active state at the H level, and internal column address signal bits CA8, /CA8 are generated according to address signal bit A8 transmitted through selector 120.

When refresh cycle mode specify signal REF4K is at the L level and specifies the 8K refresh cycle mode, selector 120 selects row address signal bit /RA12 from row address buffer 99b. In this case, in response to activation of column address decoder enable signal CADE, internal column address signal bits CA8 and /CA8 are generated according to row address signal bit /RA12. In the normal operation mode when test mode instruct signal ZMBT is at the H level, NAND gate 113 functions as an inverter. When test mode instruct signal ZMBT is brought to the L level and the test mode is specified, the output signal of NAND gate 113 is fixed at the H level in the 8K refresh cycle device. At this time, selector 120 selects row address signal bit /RA12, and according to this row address signal bit /RA12, internal column address signal bits CA8, /CA8 are generated.

As a result, in the 4K refresh cycle device, internal column address signal bit CA8 according to external address signal bit A8 is brought into a non-degenerated state (valid state), and in the 8K refresh cycle device, externally applied address signal bit A12 (RA12) is brought into a degenerated state, and the test operation is conducted internally.

In FIG. 17A, a selector portion transmitting, in the 8K refresh cycle device, external column address signal bit CA11 (A11) instead of row address signal bit RA12 is not shown. As to this portion, however, the same structure as that of selector 120 in column address buffer 30ab may be provided in row address buffer 99b. However, in the case of the x4 bit configuration, it is not necessary to provide such a selector in particular, since column address signal bit CA11 is brought into a degenerated state both in the normal operation mode and in the test operation mode.

In the above structure of address switching circuit, addresses of the 8K refresh cycle device are switched with address signal bits of the 4K refresh cycle device as a reference. On the contrary, addresses of the 4K refresh cycle device may be switched with address signal bits of the 8K refresh cycle device as a reference. This is implemented easily by exchanging address signal bits in the figure.

As described above, according to Embodiment 1, the path of the externally applied address signal is switched between the refresh cycles, so that the address signal has externally the same address signal bits degenerated in the multi-bit test mode in both refresh cycle devices. Therefore, memory cells at the same position are always brought into a selected state according to an external address signal both in the normal operation mode and in the multi-bit test mode, making it possible to carry out a test more easily and in a shorter time.

[Embodiment 2]

Figure 19:
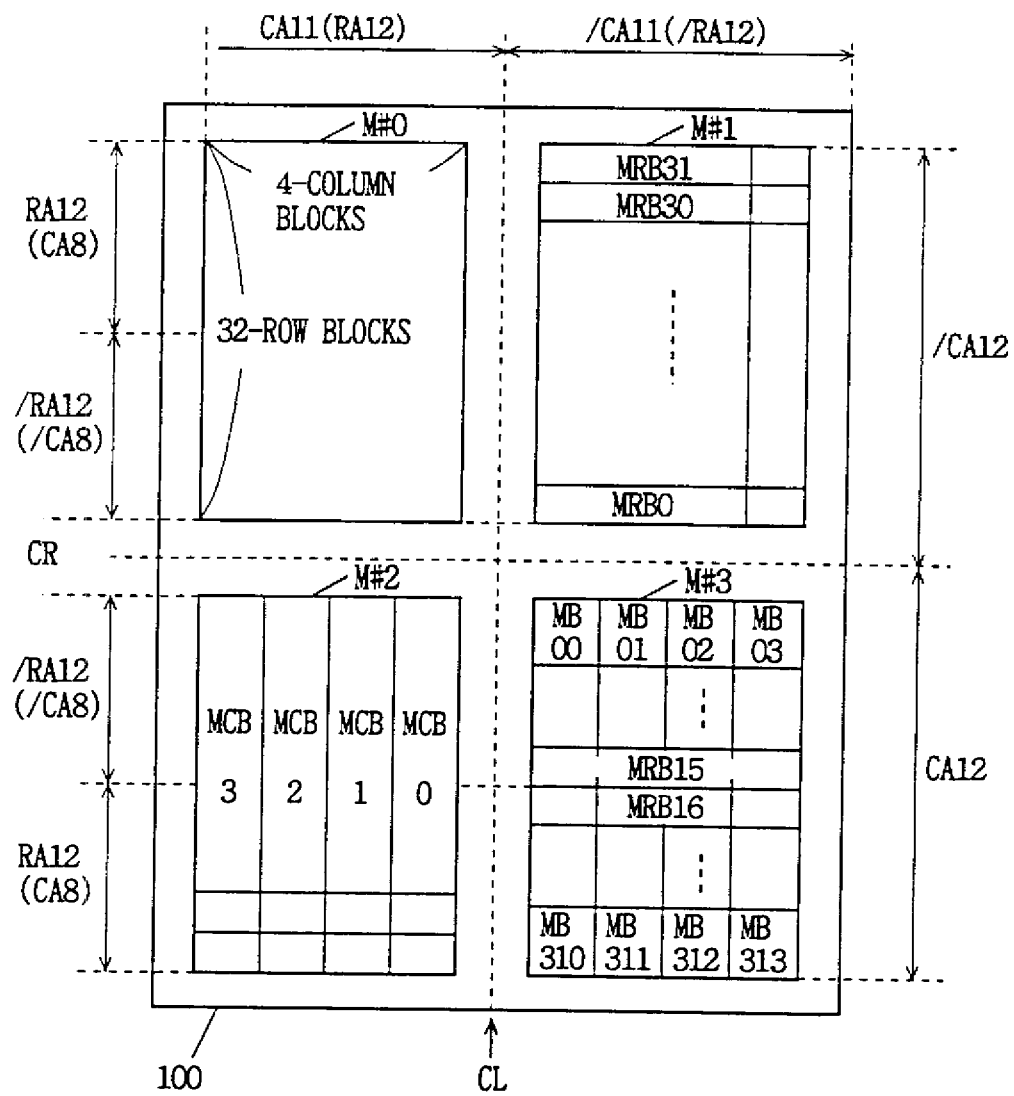
FIG. 19 is a diagram showing an arrangement of memory planes and an address allocation according to Embodiment 2 of the present invention.

FIG. 19 shows an array arrangement of a semiconductor memory device according to Embodiment 2 of the present invention. Referring to FIG. 19, this semiconductor memory device 100 includes four memory planes M#0 to M#3. These memory planes M#0 to M#3 are arranged in mirror symmetry with respect to center regions CR and CL dividing memory planes M#0 to M#3. More specifically, memory planes M#0 and M#1 have column blocks arranged in mirror (line) symmetry with respect to center region CL, and memory planes M#2 and M#3 have column blocks arranged in mirror (line) symmetry with respect to center region CL. Column blocks MCB0 of memory planes M#0 and M#2 and column blocks MCB0 of memory planes M#1 and M#3 are positioned nearest to center region CL.

Further, memory planes M#0 and M#1 have row blocks arranged in mirror symmetry to those of memory planes M#2 and M#3 with respect to center region CR. More specifically, row block MRB0 is positioned nearest to center region CR, and row block MRB31 is positioned the furthest from center region CR in each of memory planes M#0 to M#3.

When the peripheral circuits such as an address buffer and a decoder are arranged in the center portion of the center regions, a signal is propagated from these peripheral circuits to each row block and each column block through the same propagation path (since these blocks are arranged in mirror symmetry with respect to the center regions). Therefore, if one memory plane has the optimum layout and the guaranteed operation characteristics, a semiconductor memory device having four memory planes with the optimal layout and the guaranteed operation characteristics can easily be implemented by arranging the memory plane in mirror symmetry with respect to center regions CL and CR. As a result, the layout of the semiconductor memory device becomes easier. Further, since one memory plane has only to be designed, the design is simplified.

Figure 20:
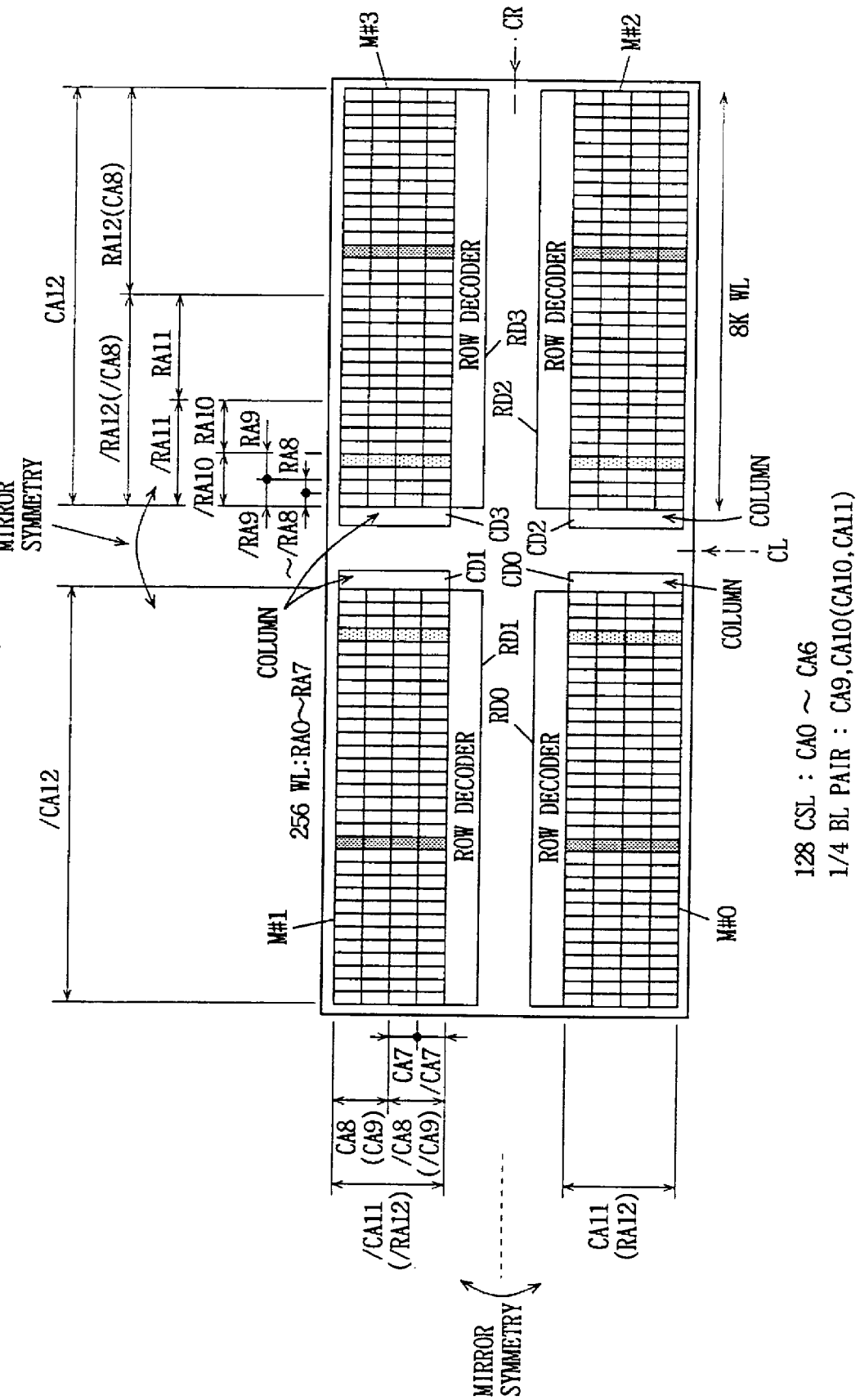
FIG. 20 is a diagram showing the address allocation according to Embodiment 2 of the present invention.

FIG. 20 shows an allocation of address signal bits of the semiconductor memory device according to Embodiment 2 of the present invention. Referring to FIG. 20, row decoders RD0 to RD3 and column decoders CD1 to CD3 are provided for memory planes M#0 to M#3, respectively. Since memory planes M#0 to M#3 have column blocks and row blocks positioned in mirror symmetry with respect to center regions CR and CL, respectively, address signal bits are similarly allocated in mirror symmetry. More specifically, by folding back the allocation of address signal bits to row blocks and word lines in memory planes M#2 and M#3 around center region CL, the allocation of address signal bits to row blocks and word lines in memory planes M#1 and M#0 is implemented. For example, the row blocks nearest to center region CL in memory planes M#1 and M#3 are specified by row address signal bits /RA12, /RA11, /RA10, /RA9, and /RA8. The allocation of addresses to word lines in each block is also in mirror symmetry. Further, the allocation of addresses to column blocks in memory planes M#1 and M#3 is in mirror symmetry to that in memory planes M#0 and M#2 with respect to center region CR. More specifically, the column blocks the nearest to center region CR are specified when column address signal bits /CA8 (/CA9 in the case of 4K refresh) and /CA7 are both at the H level. The allocation of column addresses (bits CA0 to CA6) to column select line CSL is also in mirror symmetry with respect to center region CR. Further, the allocation of column address signal bits CA9 and CA10 (CA10 and CA11 in the case of the 4K refresh cycle device) for selecting one of four bit line pairs is also in mirror symmetry.

In such a mirror symmetrical address allocation, respective row decoder circuits in row decoders RD1 to RD3 and column decoders CD0 to CD3 are arranged in mirror symmetry. By arranging memories and peripheral circuits in the array all in mirror symmetry, the layout of semiconductor memory device having a plurality of memory planes are easily implemented, and the operation characteristics thereof are easily guaranteed.

[Embodiment 3]

Figure 21:
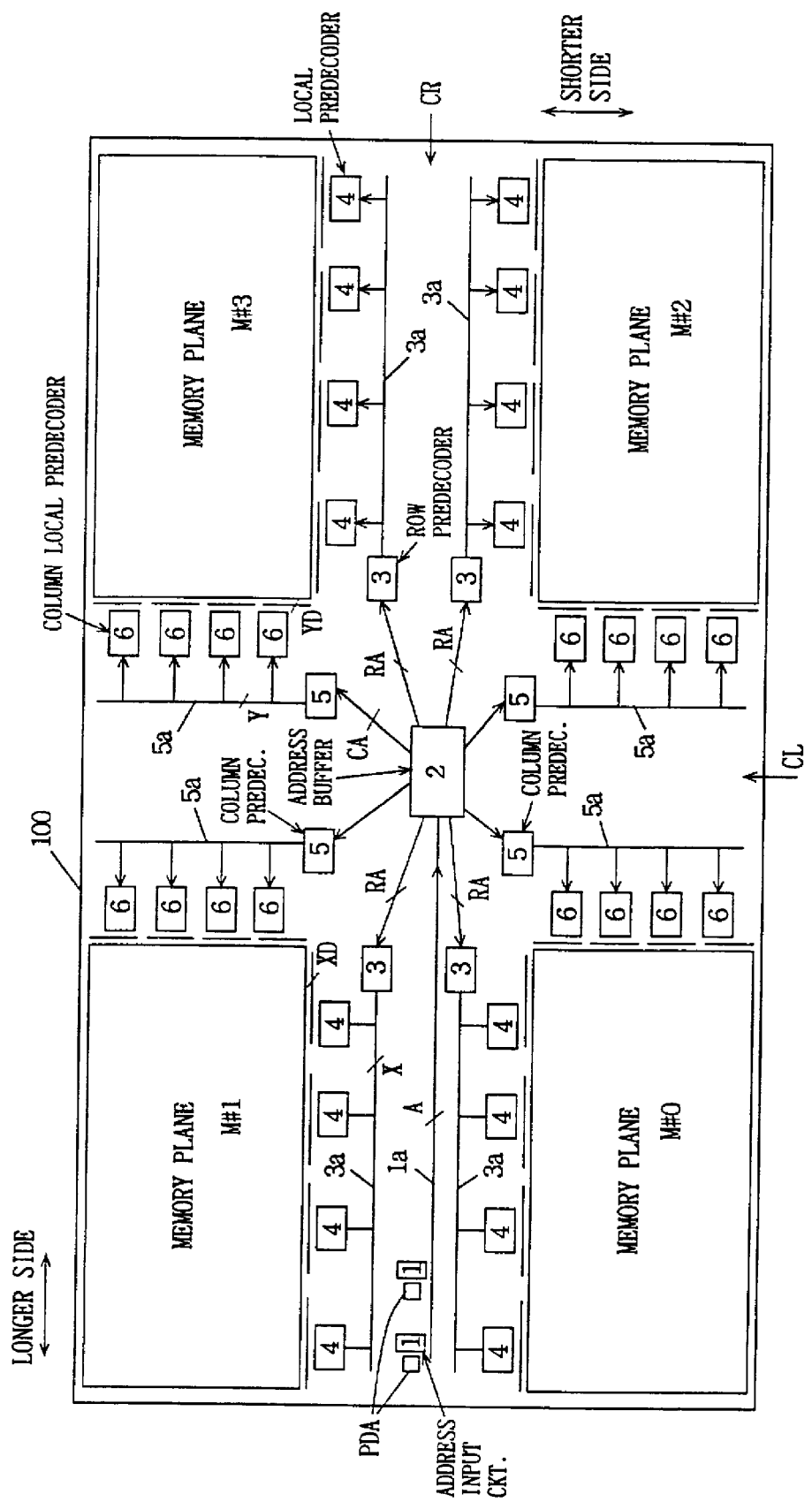
FIG. 21 is a diagram showing an arrangement of address related circuits of a semiconductor memory device according to Embodiment 3 of the present invention.

Referring to FIG. 21, address signal input pads PDA for receiving an externally applied address signal are aligned on one side (in a region between memory planes M#1 and M#0) extending in a first direction (longer side direction) of semiconductor memory device 100. Address input circuits 1 are provided adjacent to these address signal input pads PDA. Address input circuit 1 corresponds in structure to the NAND gate coupled to one of external address signal terminals 28a to 28d and the inverter receiving the output signal of this NAND gate shown in FIGS. 15 and 17. An address signal bit input by address input circuit 1 arranged adjacent to address signal input pad PDA is transmitted to an address buffer 2 arranged at the center of center regions of CR and CL through an address signal bus 1a.

Address buffer 2 includes both a row address buffer and a column address buffer. Address buffer 2 has a structure of row address buffers 99a and 99b and column address buffer 30ab shown in FIG. 17, for example. Address buffer 2 buffers an address signal from address input circuit 1 to generate a multi-bit internal row address signal RA and a multi-bit internal column address signal CA. In the following description, it is assumed that address signal bits are not switched (this address switching may be carried out with either the 4K refresh cycle device or the 8K refresh cycle device as a reference).

Internal row address signal RA from address buffer 2 is transmitted to row predecoders 3 arranged corresponding to memory planes M#0 to M#3. Internal column address signal CA is transmitted to column predecoders 5 arranged corresponding to memory planes M#0 to M#3. Row predecoders 3 are arranged in center region CR, and column predecoders 5 are arranged in center region CL. Row address signal RA and column address signal CA are transmitted radially from address buffer 2. However, by arranging row predecoders 3 at each respective one end in the longer side direction of memory planes M#0 to M#3 and arranging column predecoders 5 at each respective one end in the shorter side direction of memory planes M#0 to M#3, row address signal RA and column address signal CA are transmitted to row predecoders 3 and column predecoders 5 through the shortest interconnection lines without signal lines for transmitting row address signal RA and column address signal CA being complicated.

Row predecoder 3 predecodes row address signal RA from address buffer 2 to generate a row predecoded signal X. Row predecoder 3 transmits row predecoded signal X through a row address predecoded signal bus 3a in the first direction (longer side direction) in first center region CR. Column predecoder 5 predecodes column address signal CA from address buffer 2 for transmission through column predecoder bus 5a arranged corresponding to each of memory planes M#0 to M#3 in the shorter side direction.

Local predecoders 4 facing to center region CR are arranged in memory planes M#0 to M#3. Local predecoder 4 further predecodes row predecoded signal X from corresponding row predecoder 3 to generate a predecoded signal XD specifying one divided block (eight row blocks) of 32 row blocks divided into four blocks. As will be described later, predecoded signal XD is obtained by further predecoding predecoded signal X (X24 to X27 of FIG. 17B) obtained by predecoding row address signal bits RA11 and RA12.

In the case of the 8K refresh cycle device, row address signal bit RA12 specifies 16 row blocks (global row block) out of 32 row blocks. Address signal bit RA11 further specifies eight of 16 row blocks. Therefore, eight row blocks are specified by predecoded signal XD. This block predecoded signal XD is used for activation of row decoders provided corresponding to row blocks and generation of sense band select signals and bit line isolation signals. Only sense amplifiers for a selected row block are activated, and row blocks adjacent to the selected row block and sharing the sense amplifiers with the selected row block are isolated from the sense amplifiers.

Four local column predecoders 6 facing to center region CL are arranged corresponding to respective column blocks in each of memory planes M#0 to M#3 in the shorter side direction. Local column predecoder 6 further decodes a column predecoded signal Y from corresponding column predecoder 5 to generate a column predecoded signal YD for specifying a column group. When the column group is specified by column predecoded signal YD, a corresponding column decoder is brought into a selected state. As a result, a column decoder in the selected column group operates to bring column select line CSL into a selected state.

Figure 22:
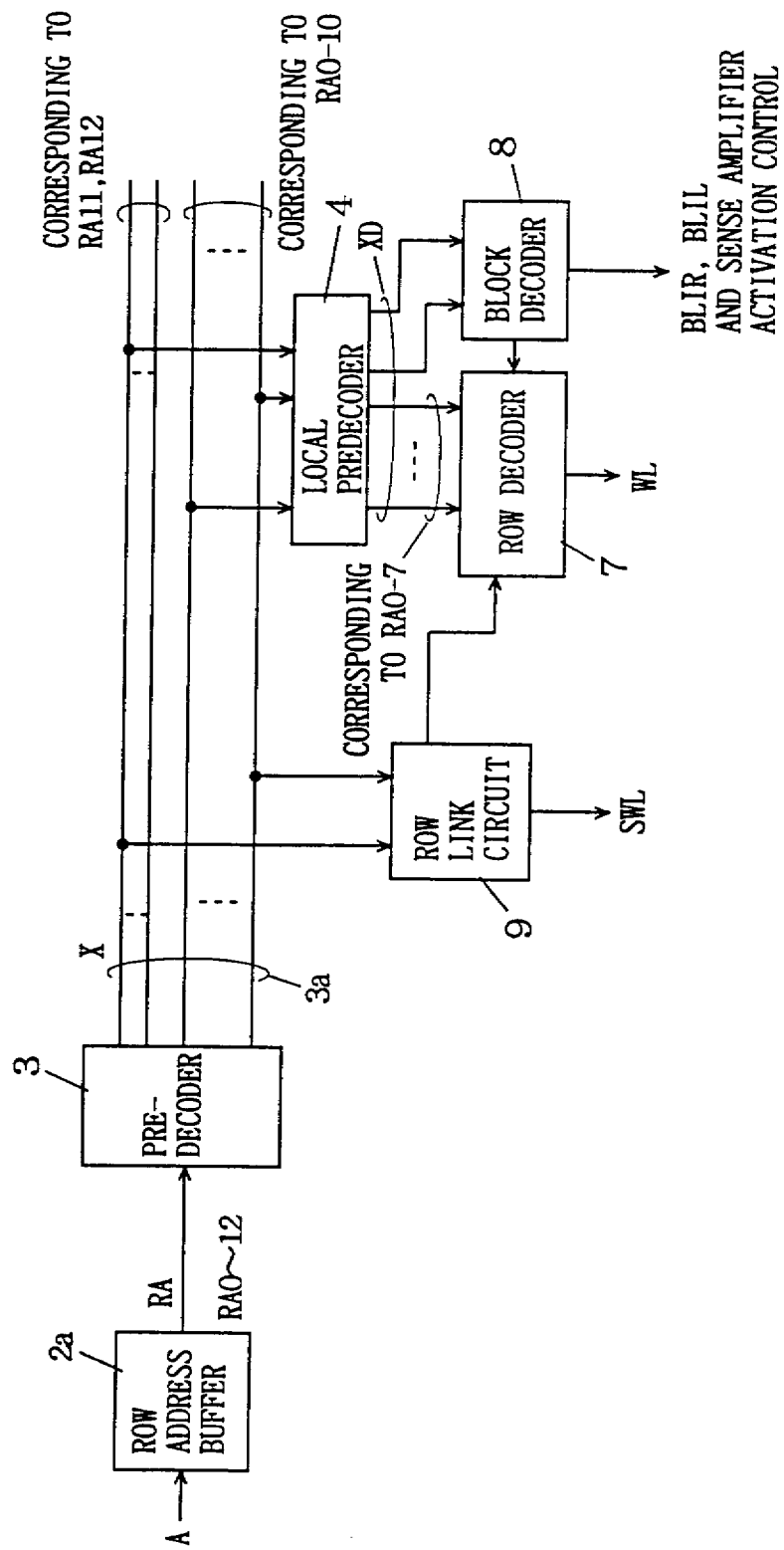
FIG. 22 is a diagram schematically showing a structure of a portion related to one row block of a row predecoder and a local predecoder shown in FIG. 21.

FIG. 22 illustrates how a row address signal is propagated to one row decoder (row block). Referring to FIG. 22, row address buffer 2a buffers an address signal A from the address input circuit shown in FIG. 21 to generate row address signal RA (RA0 to RA12). Row address buffer 2a applies the generated row address signal RA to row predecoders 3 provided corresponding to memory planes M#0 to M#3. Row predecoder 3 predecodes row address signal RA, drives predecoded lines (predecoded signal lines X24 to X27 shown in FIG. 17B) corresponding to row address signal bits RA11 and RA12, and predecodes remaining row address signal bits RA10 to RA0 for transmission through predecoded buses Sa.

In row predecoded signal bus 3a, the predecoded signals corresponding to row address signal bits RA0 to RA10 are further predecoded in local predecoder 4 selected according to the predecoded signal predecoded according to row address signal bits RA11 and RA12, and predecoded signal XD is generated. This local predecoded signal XD from local predecoder 4 specifies eight row blocks. The predecoded signal corresponding to row address signal bits RA0 to RA7 of predecoded signal XD from local predecoder 4 is transmitted to row decoders 7 provided for respective row blocks.

On the other hand, a block decoder 8 predecodes the predecoded signal corresponding to address signal bits RA8 and RA9 of predecoded signal XD from local predecoder 4 to generate bit line isolation control signals BLIR and BLIL and a signal required for sense amplifier activation control.

Block decoder 8 selects one row block according to the predecoded signal corresponding to row address signal bits RA8 to RA10, and brings the row decoder corresponding to the selected row block into an active state. When row decoder 7 is activated under the control of block decoder 8, it decodes the predecoded signal corresponding to row address signal bits RA0 to RA7 from local predecoder 6 to bring word line WL of the corresponding row block into a selected state.

In FIG. 22, a row link 9 for selecting a redundancy word line SWL to be described later is also shown. Referring to FIGS. 21 and 22, the row address signal is propagated in the longer side direction in center region CR, while the column address signal is propagated in the shorter side direction in center region CL. Since these row and column address signals are propagated only in one direction, these signal lines can be arranged linearly, resulting in a shorter interconnection line length and a smaller current consumption required for signal line charging/discharging and a reduced signal propagation delay.

Transmission of an address signal in a predecoded signal form contributes to reduction in the number of signal lines charged/discharged. For example, signal lines RA0, /RA0, RA1, and /RA1 are required for transmission of row address signal bits RA0 and RA1 without predecoding. In this case, two signal lines are charged. If these bits are predecoded, four predecoded lines are required. However, only one signal line is brought into a selected state, and therefore, the number of signal lines driven is reduced by a factor of ½. In the case of three address signal bits RA0 to RA3, six address signals are required and three of them are driven because complementary address signals are transmitted. If these address signal bits are predecoded, eight predecoded lines are required. However, since only one predecoded line is brought into a selected state, the number of signal lines driven is reduced by a factor of ⅓. Therefore, by transmitting the predecoded signal, the amount of charging/discharging current can be reduced. Further, since local predecoders 4 are arranged in memory planes M#0 to M#3, a load to be driven by row predecoder 3 is reduced. The number of row decoders to be driven by output signal lines of local predecoders 4 is reduced to ¼ of all row decoders for each memory plane. Therefore, the number of row decoders driven by each local predecoder 4 is reduced, whereby the number of these signal lines is reduced, enabling high speed charging/discharging. At the same time, the amount of charging/discharging current is also reduced. The similar effect can be seen in column predecoder 5 and local column predecoder 6.

By arranging address buffer 2 at the center of memory planes M#0 to M#3, arranging row predecoder 3 for each of memory planes M#0 to M#3 in center region CR to transmit the row address signal in the longer side direction, and arranging column predecoder 5 for each of memory planes M#0 to M#3 in center region CL to transmit the column predecoded signal in the shorter side direction as shown in FIG. 21, the structure of a portion related to the address in this semiconductor memory device is in symmetry with respect to center regions CL and CR. Therefore, the mirror symmetrical allocation of the addresses in the above described Embodiment 2 can easily be applied. As a result, by preparing one memory plane of 16M bits and arranging the memory plane in mirror symmetry with respect to center regions CL and CR, layout of the portion related to address signals can be completed, facilitating layout of the semiconductor memory device.

[Embodiment 4]

Figure 23:
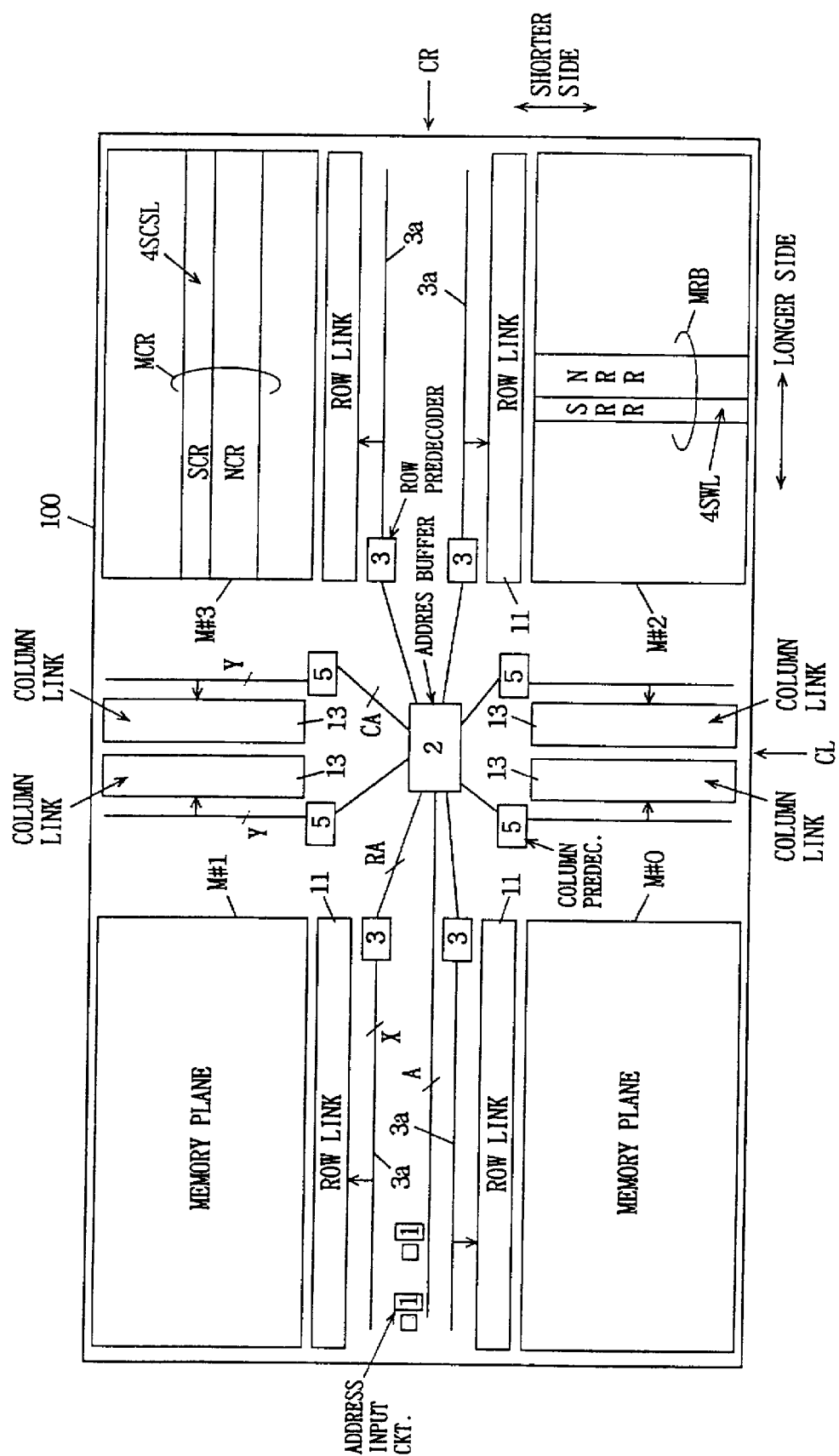
FIG. 23 is a diagram schematically showing the whole arrangement of a semiconductor memory device according to Embodiment 4 of the present invention.

Referring to FIG. 23, row link circuits 11 for repairing a defective memory cell row are arranged for memory planes M#0 to M#3 in the longer side direction in center region CR, and column links 13 for repairing a defective memory cell column are arranged for memory planes M#0 to M#3 in the shorter side direction in center region CL.

In each of memory planes M#0 to M#3, a memory row block MRB (representatively shown in memory plane M#2 in FIG. 23) includes a normal word line region NRR including normal word lines of 256 word lines and a spare word line region SRR including a spare word line SWL to replace a defective memory cell row (word line) in normal word line region NRR. Four spare word lines SWL are arranged in spare word line region SRR as one example. Row link 11 includes a fuse link element fusible by irradiation of energy ray such as a laser. If there is a defective word line (defective memory cell row) in corresponding row block MRB, the address of this defective word line is programmed by fusing the fuse link element.

In accessing, row link 11 determines whether or not the applied address specifies this defective word line by comparison between the programmed defective row address and the applied address signal. When the defective word line is addressed, row link 11 brings spare word line SWL into a selected state and a row decoder provided for normal word line region NRR into a non-active state, thereby inhibiting selection of the defective word line. In row link 11, the defective row address is programmed in a predecoded signal form. More specifically, row link 11 determines whether or not the defective row address is specified according to the predecoded signal applied from a corresponding row predecoder through row predecoded signal bus 3a.

A defective column address is programmed according to column predecoded signal Y from corresponding column predecoder 5. Column link 13 also determines whether or not a defective column is specified according to this programmed defective column address and column predecoded signal Y applied from column predecoder 5. A column block MCR includes a normal bit line (column select line) region NCR and a spare column region SCR including a spare bit line (column select line) to replace a normal bit line. As one example, four column select lines CSL are arranged in spare column region SCR. In FIG. 23, column block MCR is shown to include normal column region NCR and spare column region SCR. However, spare column region SCR may be arranged for four column blocks in common.

As described above, by replacing a defective word line and a defective bit line (defective column select line) with a spare word line and a spare column select line using row link 11 and column link 13, a defective row/column can be repaired.

As shown in FIG. 22, row link circuit 9 is arranged in each row block. This row link circuit 9 receives row predecoded signal X from corresponding row predecoder 3. Row decoder 7 provided corresponding to each row block selects a corresponding word line according to predecoded signal XD from local predecoder 4.

Figure 24:
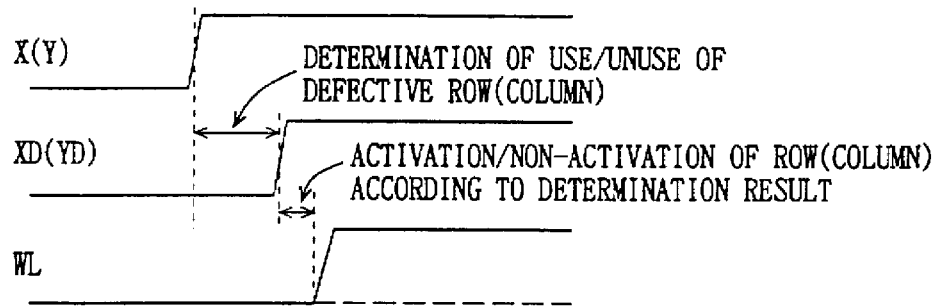
FIG. 24 is a waveform diagram for explaining the operation of the semiconductor memory device shown in FIG. 23.
Figure 25:
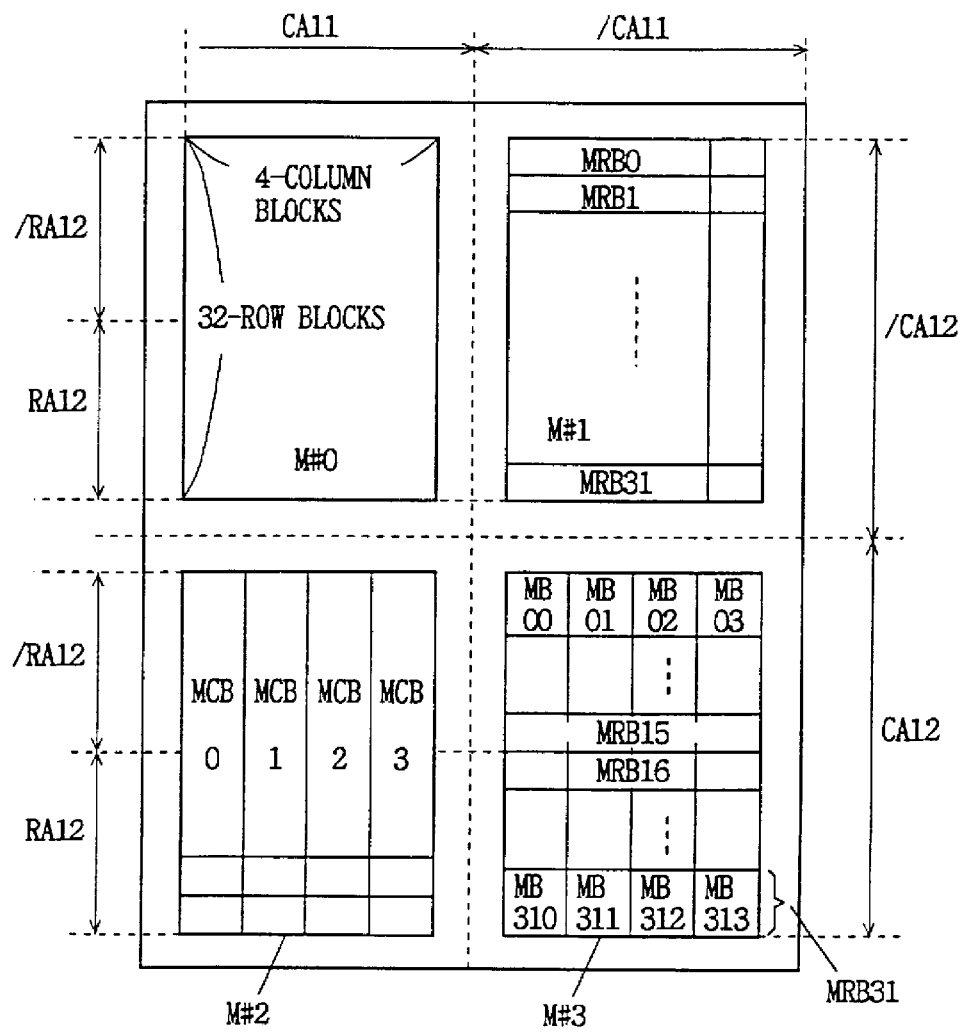
FIG. 25 is a diagram showing an arrangement of memory planes and an allocation of address signal bits in a conventional semiconductor memory device.
Figure 26:
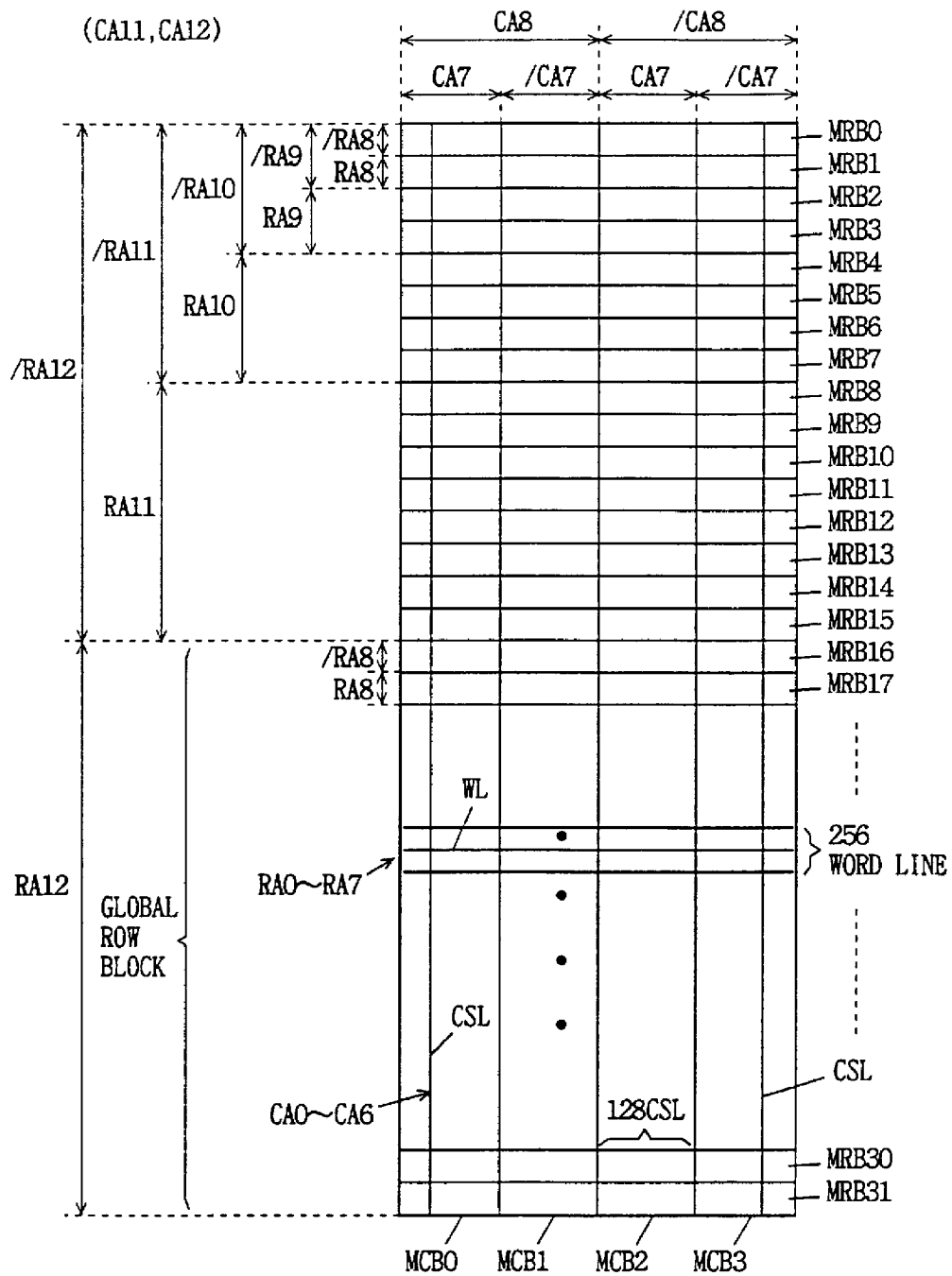
FIG. 26 is a diagram showing an allocation of address signal bits in one memory plane of the semiconductor memory device shown in FIG. 25.
Figure 27A:
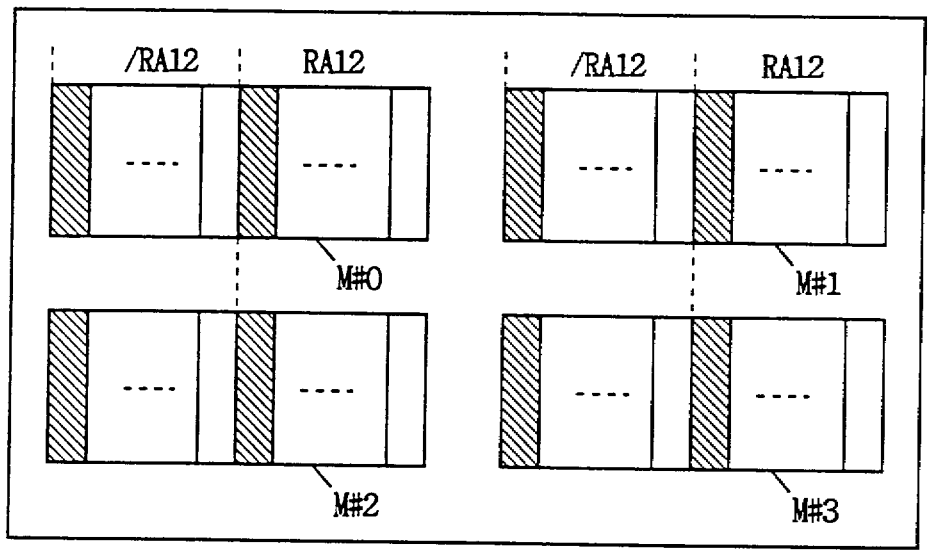
FIGS. 27A and 27B are diagrams showing an arrangement of a selected row block during the refresh cycle operation in the conventional semiconductor memory device.
Figure 27B:
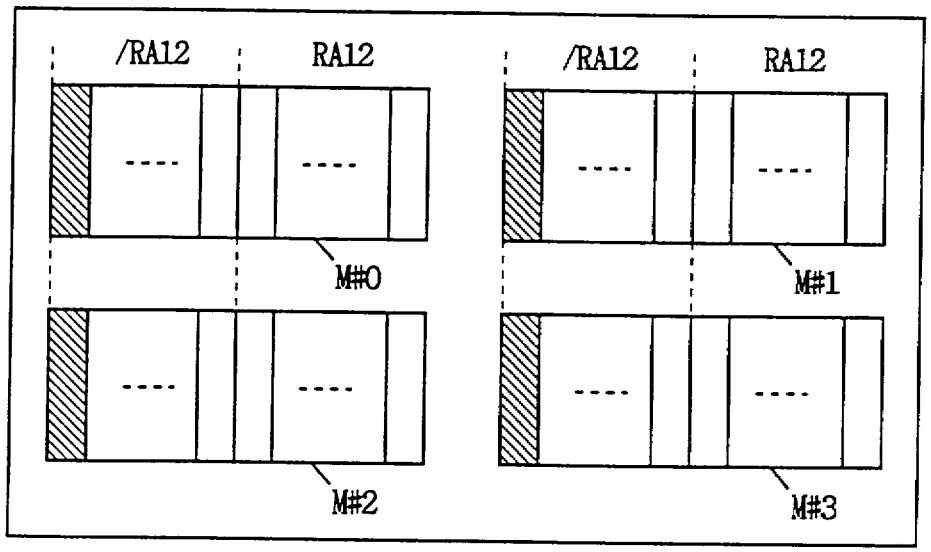
Figure 28A:
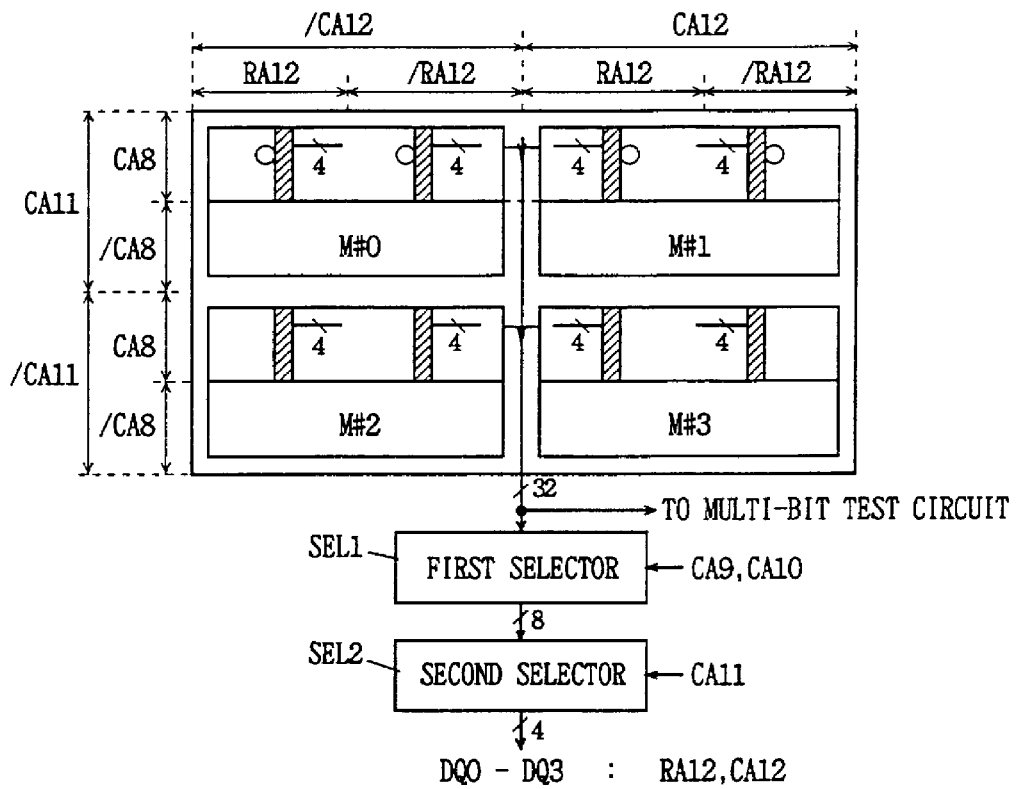
FIGS. 28A and 28B are diagrams showing the locations of selected memory cells in the conventional semiconductor memory device.
Figure 28B:
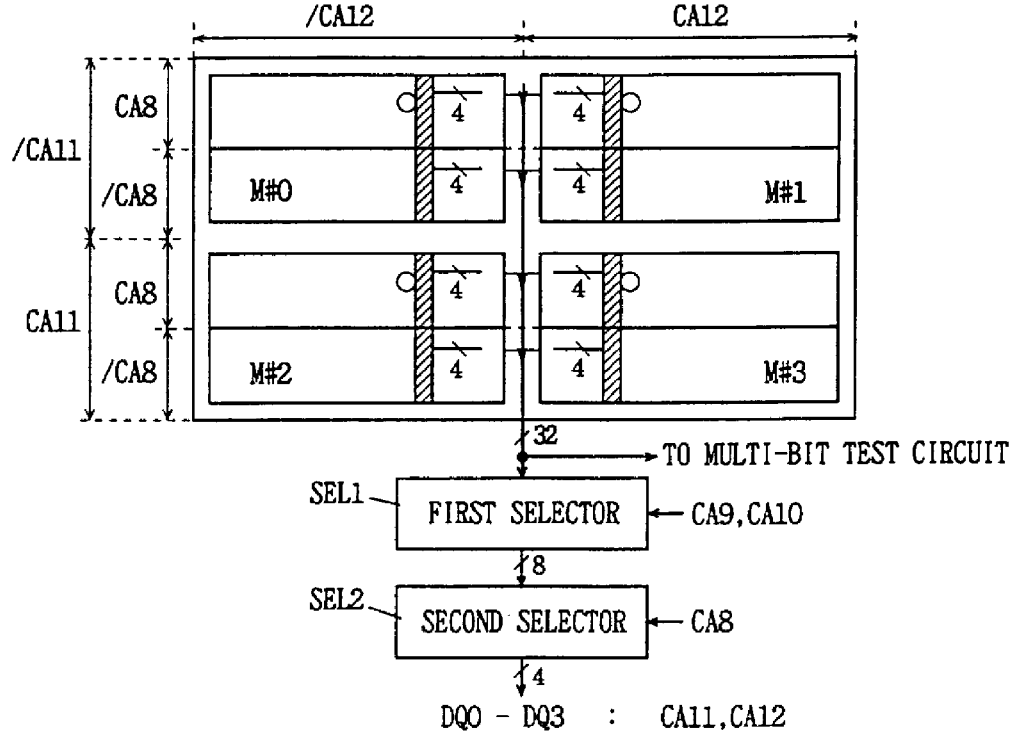

As shown in the operation waveform diagram of FIG. 24, row predecoded signal X from row predecoder 3 is brought into a definite state at a faster timing than predecoded signal XD from local predecoder 4. This is because local predecoder 4 predecodes this predecoded signal X. Therefore, row link circuit 9 can determine whether or not a defective word line (defective row) is addressed in parallel with predecoding operation of local predecoder 4. When a defective word line (defective row) is addressed, row link circuit 9 brings corresponding row decoder 7 into a non-active state, preventing selection of the defective word line. Therefore, row link circuit 9 can determine whether or not the defective row is used at a faster timing. As a result, row link circuit 9 can determine whether or not the defective row (defective word line) is addressed before the decoding operation of row decoder 7 is completed. It is not necessary to delay selection of a word line until the determination result is made valid, enabling selection of a normal word line at a faster timing.

More specifically, when row link circuit 9 (row link 11) determines whether a defective row is used or non-used in accordance with predecoded signal XD from local predecoder 4, row link circuit 9 must delay selection of a word line until the determination result is made available, since this determination operation is carried out in parallel with the decoding operation of row decoder 7. Therefore, the timing at which the word line is selected is delayed. However, by making the determination using a signal at a stage preceding that of the signal applied to row decoder 7 as in the present invention, it is not necessary to delay selection of the word line until the determination result is made available, and therefore, a word line can be brought into a selected state at a higher speed. This applies to determination of a defective column (defective column select line: defective bit line pair) by the column decoder and the column link.

As described above, according to Embodiment 4, use/non-use of a defective row or a defective column is determined using a predecoded signal at a stage preceding that of the predecoded signal applied to the row decoder or the column decoder. Therefore, it is not necessary to delay a timing at which a word line (row) or a column select line (column) is brought into a selected state in order to wait for the determination result, enabling high speed accessing. Further, by arranging row links 11 and column links 13 in the longer side direction and the shorter side direction, respectively, the links for determining use/non-use of a defective row/column can be arranged without complicated address signal propagation paths. Further, by arranging row links 11 and column links 13 in the longer side direction and the shorter side direction in correspondence to memory planes, the memory planes and the peripheral circuits related thereto can be arranged all in mirror symmetry with respect to center regions CR and CL, facilitating the layout.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory planes arranged separatedly from each other and each having a plurality of memory cells arranged in rows and columns;
   an address input circuit (1) receiving an externally applied address signal;
   an address buffer (2) arranged at the center of said plurality of memory planes for receiving an address signal from said address input circuit to generate an internal address signal;
   a plurality of row predecoders (3) arranged corresponding to said plurality of memory planes for predecoding an internal row address signal from said address buffer to transmit a predecoded row address signal to a corresponding memory plane in a first direction;
   a plurality of row decode circuits (4) arranged corresponding to each of said plurality of memory planes for decoding a row predecoded signal received from a corresponding row predecoder to select a memory cell row in a corresponding memory plane;
   a plurality of column predecoders (5) provided corresponding to said memory planes for predecoding an internal column address signal received from said address buffer to transmit an internal column predecoded signal in a second direction; and
   a plurality of column decode circuits (6) provided corresponding to each of said plurality of memory planes for decoding the internal column predecoded signal from a corresponding column predecoder to generate a column select signal for selecting a column in a corresponding memory plane.

2. The semiconductor memory device according to claim 1, wherein
   each of said plurality of memory planes includes a plurality of row blocks and a plurality of column blocks,
   said row decode circuit includes
      a row block decoder provided corresponding to each said row block for decoding the predecoded signal from a corresponding predecoder to select a row block, and
      a row decoder activated in response to an output signal from said row block decoder for decoding the row predecoded signal applied from a corresponding row predecoder to generate a signal for selecting a memory cell row of a corresponding row block, and
   said column decode circuit includes
      a column block decoder provided corresponding to each said column block for decoding the column predecoded signal from a corresponding column predecoder to select a corresponding column block, and
      a column decoder provided corresponding to each column block and activated in response to an output signal from a corresponding column block decoder for decoding the column predecoded signal from a corresponding column predecoded circuit to generate a signal for selecting a column of a corresponding column block.

3. The semiconductor memory device according to claim 1, further comprising:
   a redundancy row link arranged in said first direction corresponding to each of said plurality of memory planes and receiving the predecoded signal from a corresponding row predecoder for determining whether a defective memory cell row is specified to bring a redundancy memory cell row into a selected state according to the result of determination; and
   a redundancy column link arranged in said second direction corresponding to each of said plurality of memory planes and receiving the column predecoded signal from a corresponding column predecoder for determining whether a defective memory cell column is specified to generate a signal for selecting a redundancy memory cell column according to the result of determination result.

4. A semiconductor memory device, comprising:
   a plurality of memory planes arranged being divided by first and second center regions extending in first and second directions, each of said plurality of memory cells having a plurality of memory cells arranged in rows and columns;
   address input means receiving an externally applied address signal for generating an internal address signal;
   row select signal generating/transmitting means coupled to said address input means for generating a row select signal specifying a memory cell row from said internal address signal to transmit the generated row select signal to each of said plurality of memory planes in said first direction in said first center region;
   column select signal generating/transmitting means coupled to said address input means for generating a column select signal specifying a memory cell column from said internal address signal to transmit the generated signal to each of said plurality of memory planes in said second direction in said second center region;
   a plurality of row decode means arranged corresponding to each of said plurality of memory planes for decoding the row select signal transmitted from said row select signal generating/transmitting means to generate a signal for selecting a memory cell row of a corresponding memory plane; and a plurality of column decode means arranged corresponding to each of said plurality of memory planes for decoding a column select signal applied from said column select signal generating/transmitting means to generate a signal for selecting a column of a corresponding memory plane.

5. A semiconductor memory device, comprising:

a plurality of memory planes arranged being divided by first and second center regions extending in first and second directions, and each of the memory planes having a plurality of memory cells arranged in a plurality of rows and columns; and a plurality of selecting means arranged corresponding to each of said plurality of memory planes for selecting a memory cell according to an applied address signal, each said memory plane and each said selecting means being arranged in mirror symmetry with respect to said first and second center regions.

6. The semiconductor memory device according to claim 5, wherein each of said plurality of memory planes have said rows and columns allotted with a multi-bit address is made in mirror symmetry both with respect to said first center region and with respect to said second center region.

* * * * *